United States Patent
Namba et al.

(10) Patent No.: US 8,632,949 B2
(45) Date of Patent: Jan. 21, 2014

(54) LITHOGRAPHIC PRINTING PLATE SUPPORT AND PRESENSITIZED PLATE

(75) Inventors: Yusuke Namba, Shizuoka (JP); Keio Okano, Shizuoka (JP); Shinya Kurokawa, Shizuoka (JP); Hirokazu Sawada, Shizuoka (JP); Akio Uesugi, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 126 days.

(21) Appl. No.: 13/187,816

(22) Filed: Jul. 21, 2011

(65) Prior Publication Data

US 2012/0021356 A1    Jan. 26, 2012

(30) Foreign Application Priority Data

| Jul. 23, 2010 | (JP) | 2010-165784 |
| Feb. 25, 2011 | (JP) | 2011-039812 |
| Jul. 4, 2011 | (JP) | 2011-148202 |

(51) Int. Cl.
*B41M 5/00* (2006.01)
*B41N 1/00* (2006.01)
*G03C 1/00* (2006.01)
*G03F 7/00* (2006.01)

(52) U.S. Cl.
USPC ........... 430/278.1; 430/270.1; 430/271.1; 101/453; 101/463.1

(58) Field of Classification Search
USPC ........................... 430/270.1, 278.1
See application file for complete search history.

(56) References Cited

U.S. PATENT DOCUMENTS 7,175,964 B2 * 2/2007 Kobayashi .............. 430/270.1
2002/0182538 A1 * 12/2002 Tomita et al. ............ 430/278.1

FOREIGN PATENT DOCUMENTS

| EP | 0 485 958 A1 | 5/1992 |
| EP | 1 557 283 A1 | 7/2005 |
| JP | 59-114100 A | 6/1984 |
| JP | 4-176690 A | 6/1992 |
| JP | 2000255177 A * | 9/2000 |

OTHER PUBLICATIONS

Communication, dated Mar. 25, 2013, issued in the corresponding EP Application No. 11174834.9, 4 pages.

* cited by examiner

*Primary Examiner* — Chanceity Robinson
(74) *Attorney, Agent, or Firm* — Sughrue Mion, PLLC

(57) ABSTRACT

A presensitized plate bringing about the lithographic printing plate which exhibits a high resistance to scumming and in which formation of bulges causing image dropouts is suppressed is provided with the lithographic printing plate support which includes an aluminum plate and an anodized film of aluminum provided on the aluminum plate, and has a micropore extending in the anodized film in the direction of depth from a film surface opposite with a film surface facing the aluminum plate. The micropore is sealed at least partially on its inside with protrusions made of boehmite, and the protrusions made of boehmite which are located on the anodized film have a mean height of less than 15 nm.

6 Claims, 3 Drawing Sheets

LITHOGRAPHIC PRINTING PLATE SUPPORT AND PRESENSITIZED PLATE

BACKGROUND OF THE INVENTION

The present invention relates to lithographic printing plate supports and presensitized plates.

A conventional presensitized plate widely used includes a hydrophilic aluminum support for lithographic printing plates (hereafter referred to as "lithographic printing plate support"), and an lipophilic, photosensitive layer provided on the support. The presensitized plate as such is subjected to mask exposure through a lith film, then to developing treatment for dissolving non-image areas to remove them, so as to obtain a desired lithographic printing plate.

In recent years, computer-to-plate (CTP) technology is also employed to manufacture a lithographic printing plate with no lith films by performing a scan with light of high directivity, such as a laser beam, in accordance with the digitized image information.

The lithographic printing plate support as above is obtained by subjecting an aluminum plate to such treatments as graining treatment and anodizing treatment.

During the preparation of the support, anodizing treatment may be followed by sealing treatment with water vapor for the improvement in various properties. As an example, JP 04-176690 A discloses sealing treatment carried out "in a chamber saturated with vapor at 100° C. under 1 atmosphere" (page 9).

JP 59-114100 A discloses the treatment with water vapor to be conducted after anodizing treatment under such conditions that the temperature is 120° C., the water vapor pressure is 700 Torr, and the treatment time is 10 seconds (Table 2 on page 9).

SUMMARY OF THE INVENTION

It is known that an image dropout in round shape (also referred to as "round clear") may be generated if printing is performed using the lithographic printing plate which is obtained by subjecting a presensitized plate stored for a long period of time to exposure and developing treatment.

The present inventors found as a result of investigation on such image dropouts that a bulge with a diameter of about 100 µm may be formed in a photosensitive layer of a presensitized plate stored for a long period of time, and a bulge formed in the area to be exposed which is destined to be an image area causes an inadequate polymerization of the photosensitive layer to bring about a non-image portion after developing treatment, that is to say, makes an image dropout generated.

The present inventors also investigated bulges formed in a photosensitive layer. It was found that, as shown in FIG. 1A, aluminum carbide ($Al_4O_3$) 103 as an impurity present in the interface between metallic aluminum (Al) 101 and an anodized film 102 in a lithographic printing plate support reacts with water ($H_2O$) fed through the anodized film 102 to yield aluminum hydroxide ($Al(OH)_3$) 104, which is represented by the following formula: $Al_4C_3 + 12H_2O \rightarrow 4(Al(OH)_3) + 3CH_4$. As shown in FIG. 1B, the aluminum hydroxide 104 grows (increases in volume) to penetrate the anodized film 102 and push up a photosensitive layer 105 in a tented manner, with a bulge being thus formed.

According to the findings of the present inventors, a bulge with a diameter of about 100 µm may be formed and make a microscopic image dropout on the order of 100 µm generated even if the aluminum carbide concentration is defined to be less than 10 ppm.

The water which should react with aluminum carbide is considered to originate in rinsing treatment with water following graining treatment, anodizing treatment or the like conducted during the manufacture of a lithographic printing plate support.

Moisture passing through the photosensitive layer or protective layer formed on a lithographic printing plate support that is moisture-permeable is also deemed to react with aluminum carbide.

Under these circumstances, the present inventors newly investigated the effects of such treatments with water vapor as disclosed in JP 04-176690 A and JP 59-114100 A on bulges causing image dropouts. It was found in consequence of the investigation that, if the aluminum plate on which anodizing treatment has been conducted is subjected to treatment for bringing the plate into contact with water vapor at about 100° C., formation of bulges causing image dropouts is not suppressed and, moreover, protrusions made of boehmite ($Al_2O_3 \cdot H_2O$, or AlO(OH)) as alumina monohydrate (hereafter also referred to as "boehmite protrusions") are generated on the anodized film, leading to a poorer resistance to scumming.

An object of the present invention is to provide a lithographic printing plate support which makes it possible to obtain a presensitized plate bringing about the lithographic printing plate which exhibits a high resistance to scumming and in which formation of bulges causing image dropouts is suppressed.

In order to achieve the above object, the present inventors made diligent researches, and found that the scumming resistance is improved and formation of bulges causing image dropouts is suppressed by preparing a lithographic printing plate support so that boehmite protrusions may be present in micropores, while the mean height of boehmite protrusions on an anodized film may fall below a certain value.

In other words, the present invention provides the lithographic printing plate support and presensitized plate as described in (1) through (4) below.

(1) A lithographic printing plate support, which comprises an aluminum plate and an anodized film of aluminum provided on the aluminum plate, and has a micropore extending in the anodized film in a direction of depth from a film surface opposite with a film surface facing the aluminum plate, wherein:

the micropore is sealed at least partially on its inside with protrusions made of boehmite, and protrusions made of boehmite which are located on the anodized film have a mean height of less than 15 nm.

(2) The lithographic printing plate support according to (1), wherein a mean pore diameter (d) of said micropore and a mean height (h) of said protrusions for sealing the micropore as measured in a pore diameter direction are such that a ratio (h/d) of the mean height to the mean pore diameter is not less than 0.2.

(3) A presensitized plate comprising the lithographic printing plate support according to (1) or (2) and a photosensitive layer provided on the support, wherein the photosensitive layer contains (A) a sensitizing dye, (B) a polymerization initiator, (C) a polymerizable compound, and (D) a binder polymer.

(4) The presensitized plate according to (3), which comprises a protective layer provided on said photosensitive layer.

According to the present invention, the lithographic printing plate support can be provided that makes it possible to obtain a presensitized plate bringing about the lithographic printing plate which exhibits a high resistance to scumming and in which formation of bulges causing image dropouts is suppressed.

DETAILED DESCRIPTION OF THE INVENTION

Figure 1A:
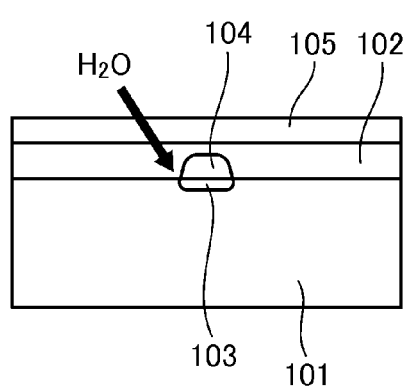
FIGS. 1A and 1B are each a schematic cross-sectional view of a conventional presensitized plate, with FIG. 1A depicting the state before a bulge is formed, and FIG. 1B depicting the state after a bulge is formed.

The lithographic printing plate support of the present invention is the lithographic printing plate support which includes an aluminum plate and an anodized film of aluminum provided on the aluminum plate, and has a micropore extending in the anodized film in the direction of depth from a film surface opposite with a film surface facing the aluminum plate. In the inventive support, the micropore is sealed at least partially on its inside with protrusions made of boehmite, and the protrusions made of boehmite which are located on the anodized film have a mean height of less than 15 nm.

First of all, the method of manufacturing a lithographic printing plate support that is adapted to obtain the lithographic printing plate support of the present invention (hereafter also referred to as "the lithographic printing plate support manufacturing method of the present invention") is explained.

<Lithographic Printing Plate Support Manufacturing Method>

The lithographic printing plate support manufacturing method of the present invention is the lithographic printing plate support manufacturing method in which an aluminum plate is subjected to anodizing treatment to obtain a lithographic printing plate support, and which includes the step of conducting the anodizing treatment and, subsequent to the anodizing treatment step, the step of conducting the treatment with water vapor in which the aluminum plate is brought into contact with water vapor at a temperature of 130 to 350° C.

In the following, the aluminum plate to be used in the lithographic printing plate support manufacturing method of the present invention is initially described, then the individual steps of the manufacturing method are detailed.

<Aluminum Plate>

The aluminum plate to be used is composed of the aluminum-based metal which is dimensionally stable, that is to say, of aluminum or an aluminum alloy. Selection is made from among a pure aluminum plate, an aluminum alloy plate containing small amounts of alloying element or elements, and the plastic film or paper which aluminum (an aluminum alloy) is laminated to or evaporated on. A composite sheet having an aluminum sheet combined with a polyethylene terephthalate film, such as described in JP 48-18327 B, will also do.

In the following description, the plates composed of aluminum or an aluminum alloy as described above are collectively called "aluminum plate." The alloying element or elements to be contained in an aluminum alloy plate are exemplified by silicon, iron, manganese, copper, magnesium, chromium, zinc, bismuth, nickel and titanium, and the alloying element content is not more than 10% by weight. The aluminum plate is desirably a pure aluminum plate, while it may contain trace amounts of foreign elements because aluminum of absolute purity is hard to produce for reasons of refining technology. The aluminum plate as such may be composed of a known material conventionally used, JIS A 1050, JIS A 1100, JIS A 3103 or JIS A 3005 material for instance.

The aluminum plate additionally contains aluminum carbide ($Al_4C_3$) as an inevitable impurity. The aluminum carbide concentration of the aluminum plate is preferably not more than 15 ppm, more preferably not more than 10 ppm, because formation of bulges causing image dropouts is further suppressed at concentrations within the range. While no particular limitation is imposed on the lower limit of the aluminum carbide concentration, it is normal that the aluminum carbide concentration is indispensably not less than 1 ppm.

The aluminum carbide concentration is determined by gas chromatography (compliant with Light Metal Industrial Standard LIS-A07-1971).

In general, the aluminum plate is in the form of a web about 400 to 2000 mm wide and about 0.1 to 0.6 mm thick, and is subjected to treatment while continuously transported. The thickness may be selected as appropriate to the size of a printing press, the size of a printing plate, and the requirements of the user.

<Graining Treatment Process>

The lithographic printing plate support manufacturing method of the present invention may include the step of conducting graining treatment, such as electrochemical graining treatment, on the surface of the above aluminum plate. It is preferable to conduct graining treatment before the anodizing treatment as described later, although graining treatment can be omitted if the aluminum plate already has a favorable surface profile.

<Electrochemical Graining Treatment>

Electrochemical graining treatment is suitable for the attainment of a lithographic printing plate having excellent printing properties because fine asperities (pits) are readily provided at the surface of an aluminum plate by the treatment.

Electrochemical graining treatment is conducted using direct or alternating current in an aqueous solution chiefly containing nitric acid or hydrochloric acid.

Description is made on aqueous solutions for electrochemical graining treatment usable in the present invention.

The aqueous solution for electrochemical graining treatment which chiefly contains nitric acid may be a nitric acid-based aqueous solution for the conventional electrochemical graining treatment using direct or alternating current, namely, the 1 to 100 g/L aqueous solution of nitric acid to which at least one out of nitric acid compounds containing nitrate ion, such as aluminum nitrate, sodium nitrate and ammonium nitrate; hydrochloric acid compounds containing chloride ion, such as aluminum chloride, sodium chloride and ammonium chloride; and so forth is added in an amount ranging from 1 g/L to the saturation amount.

In the nitric acid-based aqueous solution, metal, such as iron, copper, manganese, nickel, titanium and magnesium, or silicon contained in an aluminum alloy may be dissolved.

A preferred solution may be prepared by adding aluminum chloride and/or aluminum nitrate to a 0.5 to 2 wt % aqueous solution of nitric acid so that the resultant solution may have an aluminum ion concentration of 3 to 50 g/L.

The solution temperature is preferably 10 to 90° C., and more preferably 40 to 80° C.

The aqueous solution for electrochemical graining treatment which chiefly contains hydrochloric acid may be a hydrochloric acid-based aqueous solution for the conventional electrochemical graining treatment using direct or alternating current, namely, the 1 to 100 g/L aqueous solution of hydrochloric acid to which at least one out of nitric acid compounds containing nitrate ion, such as aluminum nitrate, sodium nitrate and ammonium nitrate; hydrochloric acid compounds containing chloride ion, such as aluminum chloride, sodium chloride and ammonium chloride; and so forth is added in an amount ranging from 1 g/L to the saturation amount.

In the hydrochloric acid-based aqueous solution, metal, such as iron, copper, manganese, nickel, titanium and magnesium, or silicon contained in an aluminum alloy may be dissolved.

A preferred solution may be prepared by adding aluminum chloride and/or aluminum nitrate to a 0.5 to 2 wt % aqueous solution of hydrochloric acid so that the resultant solution may have an aluminum ion concentration of 3 to 50 g/L.

The solution temperature is preferably 10 to 60° C., and more preferably 20 to 50° C. Hypochlorous acid may also be added.

The AC source waveform for electrochemical graining treatment may be a sinusoidal, square, trapezoidal or triangular waveform. Preferred frequencies fall within the range of 0.1 to 250 Hz.

Figure 3:
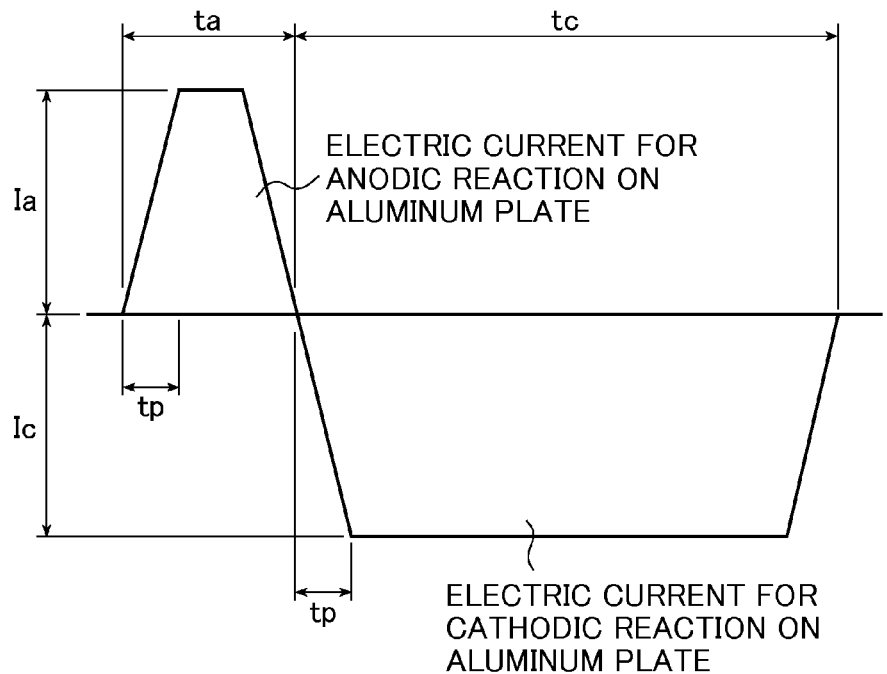
FIG. 3 is a graph showing an exemplary waveform of alternating current used for electrochemical graining treatment in the lithographic printing plate support manufacturing method of the present invention.

FIG. 3 is a graph showing an exemplary waveform of alternating current used for electrochemical graining treatment in the lithographic printing plate support manufacturing method of the present invention.

In FIG. 3, the time for anodic reaction is denoted by "ta", the time for cathodic reaction by "tc", the time for the transition of current from zero to peak by "tp", the current at peak on the anode cycle side by "Ia", and the current at peak on the cathode cycle side is denoted by "Ic". In the trapezoidal wave as shown, the time tp for the transition of current from zero to peak is preferably 1 to 10 msec. If the time tp is shorter than 1 msec, a large source voltage is required upon the rise of the current waveform under the influence of the impedance of a power supply circuit, so that the cost of power supply equipment goes up. If the time tp is longer than 10 msec, uniform graining is hard to achieve due to an increased susceptibility to trace ingredients in an electrolyte solution. One cycle of alternating current used for electrochemical graining is preferably defined so that the ratio tc/ta between the time for cathodic reaction tc and the time for anodic reaction ta, both reactions occurring on the aluminum plate, may be 1 to 20, the ratio of the amount of electricity Qc at the time of cathodic reaction on the aluminum plate to the amount of electricity Qa at the time of anodic reaction, Qc/Qa, may be 0.3 to 20, and the time for anodic reaction to may be 5 to 1000 msec. A ratio tc/ta of 2.5 to 15 and a ratio Qc/Qa of 2.5 to 15 are more preferred. The current density is preferably 10 to 200 A/dm² at either of the peak values Ia and Ic of a trapezoidal wave current on its anode and cathode cycle sides. The ratio Ic/Ia is preferably 0.3 to 20. The total amount of electricity used for the anodic reaction on the aluminum plate is preferably 25 to 1000 C/dm² at the end of electrochemical graining.

For the electrochemical graining to be carried out using alternating current, a known electrolytic cell of a vertical, flat or radial type for use in surface treatment may be used, with such a radial-type cell as described in JP 5-195300 A being particularly preferred.

Figure 4:
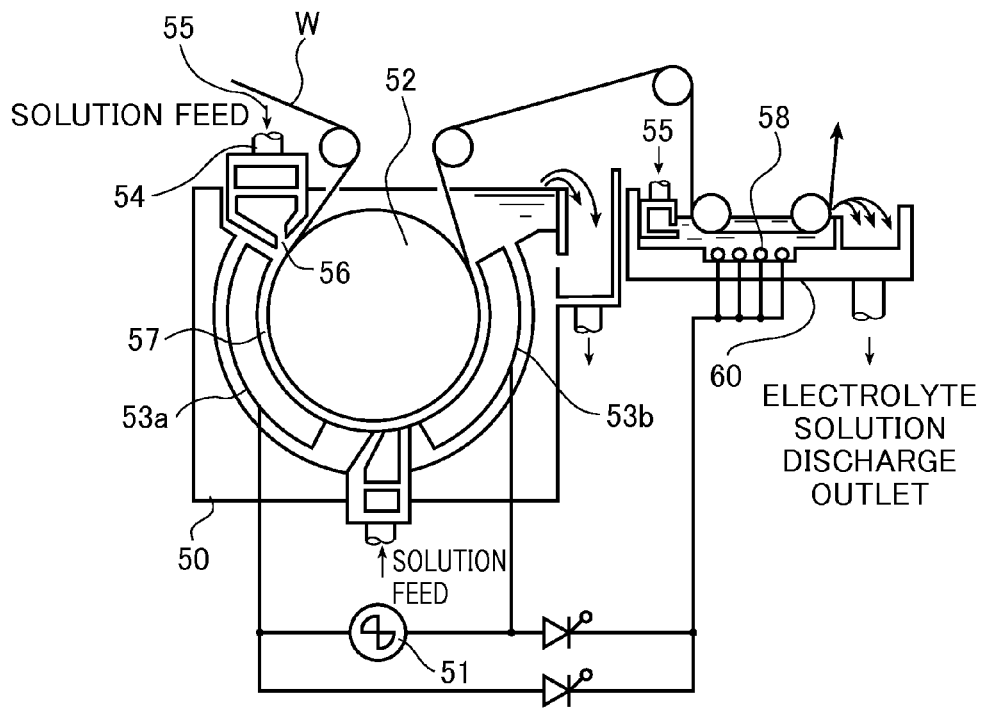
FIG. 4 is a schematic diagram showing an example of the radial-type cell which is adapted for electrochemical graining treatment using alternating current and conducted in the lithographic printing plate support manufacturing method of the present invention.

The apparatus as shown in FIG. 4 may be used for electrochemical graining with alternating current.

FIG. 4 is a schematic diagram showing an example of the radial-type cell which is adapted for electrochemical graining treatment using alternating current and conducted in the lithographic printing plate support manufacturing method of the present invention.

FIG. 4 shows a principal electrolytic cell 50, an AC source 51, a radial drum roller 52, principal electrodes 53a and 53b, a solution feed inlet 54, an electrolyte solution 55, a slit 56, a solution passage 57, an auxiliary anode 58, an auxiliary anode cell 60, and an aluminum plate W. If two or more electrolytic cells are to be used, conditions for electrolysis may or may not vary with cell.

The aluminum plate W is wound onto the radial drum roller 52 immersed in an electrolyte solution in the principal electrolytic cell 50, and subjected in the course of transportation to electrolysis treatment by means of the principal electrodes 53a and 53b connected with the AC source 51. The electrolyte solution 55 is fed from the solution feed inlet 54 through the slit 56 into the solution passage 57 between the radial drum roller 52 and the principal electrodes 53a and 53b. The aluminum plate W as treated in the principal electrolytic cell 50 is then subjected to another electrolysis treatment in the auxiliary anode cell 60. In the auxiliary anode cell 60, the auxiliary anode 58 is positioned opposite to the aluminum plate W, and the electrolyte solution 55 is so fed as to flow through the space between the auxiliary anode 58 and the aluminum plate W.

Electrochemical graining treatment may also be conducted by passing direct current between an aluminum plate and electrodes opposite to the plate so as to carry out electrochemical graining.

In the graining treatment, electrochemical graining treatment may be conducted as a sole treatment, or in combination with mechanical graining treatment and/or chemical graining treatment.

If combined with mechanical graining treatment, electrochemical graining treatment is preferably conducted after the mechanical one.

<Mechanical Graining Treatment>

Mechanical graining treatment is generally conducted in order to impart a surface roughness Ra of 0.35 to 1.0 μm to the surface of an aluminum plate.

Mechanical graining treatment is not particularly limited in conditions but may be conducted by following the method as described in JP 50-40047 B. It is also possible to carry out mechanical graining by a brush graining treatment using a pumice stone suspension, or a graining treatment through transcription.

Preferably, mechanical graining treatment is conducted with rotating nylon roller brushes having a bristle diameter of 0.2 to 1.61 mm, and a slurry of abrasive fed onto the aluminum plate surface.

Any known abrasive is usable, while silica sand, quartz, aluminum hydroxide, or a mixture thereof is preferred. The specific gravity of the slurry is preferably 1.05 to 1.3.

As a matter of course, mechanical graining may also be achieved by spraying an abrasive slurry, using wire brushes, or transferring asperities provided at the surface of a roll for rolling to an aluminum plate.

<Chemical Graining Treatment>

Chemical graining treatment is not particularly limited either but may be conducted conventionally.

Mechanical graining treatment is preferably followed by the chemical etching treatment as described below. Chemical etching treatment following mechanical graining treatment is conducted in order to smooth edges of asperities provided at the aluminum plate surface so that ink may be prevented from catching on the edges during printing and the scumming resistance of a lithographic printing plate may thus be improved, and remove unwanted matter such as abrasive particles remaining on the plate surface.

Known chemical etching treatments include those with an acid or alkali, whereupon chemical etching treatment with an alkali solution (hereafter also referred to as "alkali etching treatment") is particularly excellent in etching efficiency.

The alkali agent to be used for the above alkali solution is not particularly limited, and preferred examples include caustic soda, caustic potash, sodium metasilicate, sodium carbonate, sodium aluminate, and sodium gluconate.

The alkali agent may contain an aluminum ion. The concentration of the alkali solution is preferably not less than 0.01% by weight, and more preferably not less than 3% by weight, but preferably not more than 30% by weight, and more preferably not more than 25% by weight.

The temperature of the alkali solution is preferably room temperature or higher, and more preferably 30° C. or higher, but preferably not higher than 80° C., and more preferably not higher than 75° C.

The etching amount is preferably not less than 0.1 $g/m^2$, and more preferably not less than 1 $g/m^2$, but preferably not more than 20 $g/m^2$, and more preferably not more than 10 $g/m^2$.

The treatment time is preferably two seconds to five minutes depending on the etching amount, with a treatment time of two to ten seconds being more preferable from the viewpoint of increasing the productivity.

If alkali etching treatment has been conducted after mechanical graining treatment, it is preferable to conduct chemical etching treatment with an acid solution of low temperature (hereafter also referred to as "desmutting treatment") in order to remove products resulting from the alkali etching treatment.

The acid to be used for the above acid solution is not particularly limited but exemplified by sulfuric acid, nitric acid, and hydrochloric acid. The concentration of the acid solution is preferably 1 to 50% by weight. The temperature of the acid solution is preferably 20 to 80° C. If the concentration and temperature of the acid solution fall within the above ranges, respectively, the lithographic printing plate in which the lithographic printing plate support of the present invention is used will have a much improved resistance to dotty scumming.

In the graining treatment as described above, electrochemical graining treatment is conducted after mechanical graining treatment and chemical etching treatment conducted if desired. Chemical etching treatment with an alkali solution containing caustic soda or the like may be conducted before electrochemical graining treatment even if the electrochemical graining treatment is to be conducted with no preceding mechanical graining treatment. In that case, impurities and so forth present in the vicinity of the aluminum plate surface can be removed.

Electrochemical graining treatment is preferably followed by the chemical etching treatment as described below. Smut or intermetallic compounds are present on the surface of the aluminum plate as subjected to electrochemical graining treatment. In chemical etching treatment following electrochemical graining treatment, it is preferable especially for an efficient removal of smut to initially conduct chemical etching treatment with an alkali solution (alkali etching treatment). The chemical etching treatment with an alkali solution is preferably conducted under such conditions that the treatment temperature is 20 to 80° C., and the treatment time is 1 to 60 seconds. The alkali solution preferably contains aluminum ions.

After electrochemical graining treatment has been followed by a chemical etching treatment with an alkali solution, a chemical etching treatment with an acid solution of low temperature (desmutting treatment) is preferably conducted in order to remove products resulting from the chemical graining treatment with an alkali solution.

It is preferable for an efficient removal of smut to conduct desmutting treatment even if no alkali etching treatment follows electrochemical graining treatment.

None of the chemical etching treatments as described above is particularly limited in method, with exemplary methods including immersion, showering, and coating.

<Anodizing Treatment Process>

In anodizing treatment, an anodized film as an aluminum oxide film having a micropore extending in the direction of depth (direction of film thickness) is formed on the surface of an aluminum plate (including the aluminum plate as subjected to the above graining treatment) by performing anodization on the aluminum plate with direct or alternating current caused to pass through the plate.

Various electrolytes adapted for the formation of an anodized film are usable for anodizing treatment. In general, sulfuric acid, hydrochloric acid, oxalic acid, chromic acid, or a mixture of such acids is used. The electrolyte concentration is selected as appropriate to the electrolyte to be used.

Conditions for anodizing treatment vary with the electrolyte to be used. Typically preferred conditions are: an electrolyte solution concentration of 1 to 80% by weight; a solution temperature of 5 to 70° C.; a current density of 5 to 60 $A/dm^2$; a voltage of 1 to 100 V; and an electrolysis time of ten seconds to five minutes.

The amount of an anodized film formed is preferably 1.0 to 5.0 $g/m^2$, and more preferably 1.5 to 4.0 $g/m^2$. Amounts within the range allow a good press life and a high scratch resistance of non-image areas of a lithographic printing plate.

<Water Vapor Treatment Process>

In water vapor treatment following the above anodizing treatment, the aluminum plate as described before (including the aluminum plate as subjected to the above graining treatment and/or the above anodizing treatment) is treated with water vapor, that is to say, the aluminum plate is brought into contact with water vapor.

Water vapor for the water vapor treatment is 130 to 350° C. in temperature.

Aluminum carbide ($Al_4C_3$) present in the vicinity of the surface of the aluminum plate is converted into aluminum hydroxide ($Al(OH)_3$) by contact with water vapor ($H_2O$) at a temperature within the above range, and as such grows (increases in volume).

Figure 2:
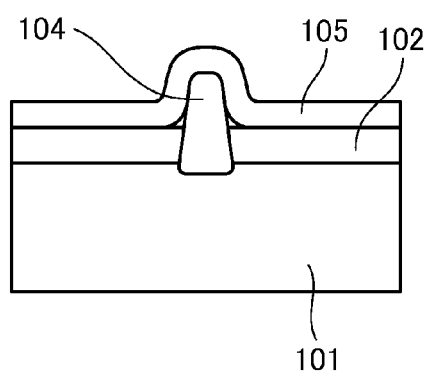
FIG. 2 is a schematic cross-sectional view of a presensitized plate using a lithographic printing plate support obtained by the lithographic printing plate support manufacturing method of the present invention.

It is assumed accordingly that the photosensitive layer 105 as described later is formed along the aluminum hydroxide 104 having grown as shown in FIG. 2. Since the aluminum hydroxide 104 has already finished growing (increasing in volume) when the photosensitive layer 105 is formed, and no more grows even if moisture is fed, the photosensitive layer 105 as formed will never be pushed up in time. Formation of bulges causing image dropouts is thus suppressed.

As described before, a treatment with water vapor at 100° C. or 120° C. conducted after anodizing treatment generates boehmite protrusions on an anodized film.

In contrast, the water vapor treatment as above suppresses generation of boehmite protrusions, leading to an improvement in scumming resistance.

While the aluminum plate as described before is reduced in strength due to an annealing effect if subjected to a treatment with water vapor at a temperature over 350° C., the aluminum plate subjected to the water vapor treatment as above employing water vapor at a temperature not higher than 350° C. maintains a high strength.

The pressure under which the water vapor treatment is to be conducted is preferably 0.3 to 1 atm, and more preferably 0.5 to 1 atm.

Formation of bulges causing image dropouts is likely to be suppressed more effectively with a longer treatment time for the water vapor treatment, whereas generation of boehmite protrusions on an anodized film is likely to be suppressed more effectively and the protrusions as generated are likely to be smaller in the mean height with a shorter treatment time. In view of such tendencies, the treatment time is preferably 1 to 60 seconds.

The temperature of the water vapor to be used for the water vapor treatment is preferably 150 to 350° C., more preferably 180 to 350° C., and even more preferably 200 to 350° C. because more desirable effects are achieved at such temperatures.

The method of bringing the aluminum plate into contact with water vapor is not particularly limited. The aluminum plate may be caused to run through a box filled with water vapor produced by boiling water, or water vapor may be ejected onto the aluminum plate directly through a steam nozzle.

<Hydrophilizing Treatment Process>

The lithographic printing plate support manufacturing method of the present invention may include the step of conducting hydrophilizing treatment subsequent to the steps of conducting the anodizing treatment and water vapor treatment as described above. In hydrophilizing treatment, the aluminum plate as subjected to the above anodizing treatment and water vapor treatment is further subjected to hydrophilization.

The known method as disclosed in paragraphs [0109] through [0114] of JP 2005-254638 A, for instance, is usable for hydrophilizing treatment, while it is preferable to carry out hydrophilization by immersion in an aqueous solution of alkali metal silicate such as sodium silicate and potassium silicate; application of a hydrophilic vinyl polymer or a hydrophilic compound to form a hydrophilic undercoat; or the like.

Hydrophilizing treatment with an aqueous solution of alkali metal silicate such as sodium silicate and potassium silicate may be conducted by following the methods and procedures as described in U.S. Pat. Nos. 2,714,066 and 3,181,461.

Hydrophilizing treatment utilizing a hydrophilic undercoat may be conducted by following the methods and procedures as described in JP 59-101651 A and JP 60-149491 A.

<Preapplying Treatment Process>

The lithographic printing plate support manufacturing method of the present invention may include the step of conducting water preapplying treatment between the anodizing treatment and the water vapor treatment.

In water preapplying treatment (hereafter referred to as "preapplying treatment"), water is applied before the water vapor treatment to the anodized film which is formed on the surface of the aluminum plate as subjected to the anodizing treatment.

As will be described later, condensed water on the surface of the anodized film is deemed to be removed by the drying effect of water vapor at 130 to 350° C. (so-called superheated steam) used for the water vapor treatment. Superheated steam at a higher temperature has a greater drying effect, that is to say, making superheated steam too hot will cause not only the water on the surface of the anodized film but in a micropore in the anodized film to be removed, which may suppress generation of boehmite protrusions in the micropore. In that case, formation of bulges causing image dropouts is suppressed less effectively (the mechanism to suppress bulge formation being described later).

Under these circumstances, preapplying treatment is so conducted that an adequate amount of water may be added before the water vapor treatment so as to obtain more desirable effects of the water vapor treatment.

Preapplying treatment is more effective as the water vapor treatment is conducted with water vapor of higher temperature. In view of this, the temperature of water vapor used for the water vapor treatment is preferably 170 to 350° C.

While the water vapor treatment achieves more desirable effects as it is conducted for a longer period of time, preapplying treatment also makes it possible to obtain similar effects in a reduced treatment time for the water vapor treatment.

If preapplying treatment is to be conducted, it is preferable that the aluminum plate as subjected to the anodizing treatment is dried before water is applied thereto. The method to be used for the drying is not particularly limited.

The amount of water applied is 0.5 to 10 cc/m$^2$, for instance, whereupon an amount of 1 to 6 cc/m$^2$ is preferable because more desirable effects are achieved.

The water to be applied is preferably pure water, and its temperature is not particularly limited.

The water applying method may be a common, wet coating method specifically exemplified by dip coating, roll coating, bar coating, blade coating, air-knife coating, slot-die coating, spray coating, and slide coating, whereupon roll coating of a contact type is particularly preferred from the viewpoint of application consistency.

If roll coating is to be employed, the material for the surface of a roll used is preferably rubber lest the anodized film be damaged by friction, with examples of usable rubbers including ethylene-propylene-diene (EPDM) rubber, silicone rubber, urethane rubber, polyvinyl alcohol (PVA), and FORTEM (manufactured by MEIJI RUBBER & CHEMICAL CO., LTD.).

In roll coating, especially with the roll whose surface is made of rubber, the amount of water applied can be controlled by modifying the diameter of a touch roll, the hardness of rubber, the touching width, the touching pressure, the thickness of a rubber layer, and so forth.

The roll for roll coating may be provided in its surface with grooves parallel to the direction in which the aluminum plate is to be transported; grooves diagonal to the direction in which the aluminum plate is to be transported; latticed grooves; honeycombed grooves; or the like, as is the case with normal roll coating, so as to allow water to be applied more uniformly in amount across the width of the aluminum plate.

<Lithographic Printing Plate Support>

The lithographic printing plate support of the present invention is a lithographic printing plate support obtained by the lithographic printing plate support manufacturing method of the present invention.

Figure 6:
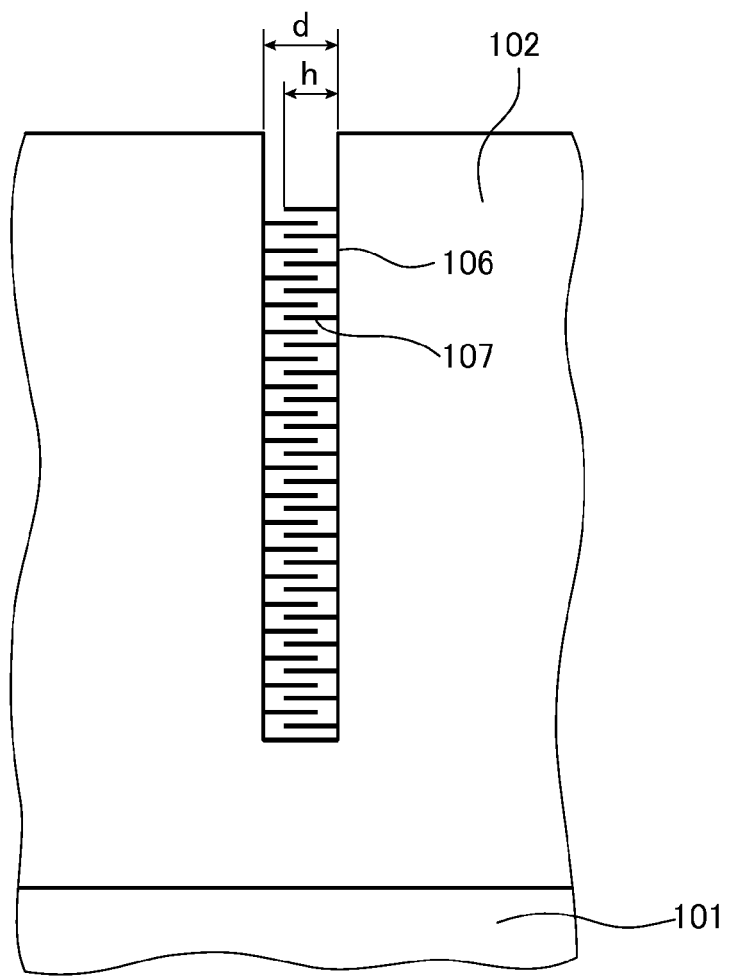
FIG. 6 is a schematic cross-sectional view of part of the lithographic printing plate support of the present invention.

The lithographic printing plate support of the present invention is detailed below based on FIG. 6. FIG. 6 is a schematic cross-sectional view of part of the lithographic printing plate support of the present invention.

As shown in FIG. 6, in the lithographic printing plate support of the present invention, a micropore 106 is sealed at least partially on its inside with boehmite protrusions 107. To be more specific: The boehmite protrusions 107 are generated from the inner wall of the micropore 106 by the hydration reaction between aluminum oxide and water, growing in the direction of the pore diameter (shown in FIG. 6 with "d") of the micropore 106. In FIG. 6, the height of the boehmite protrusions 107 as measured in the direction of pore diameter (d) is shown with "h."

Under the circumstances where the micropore 106 is sealed with the boehmite protrusions 107, moisture hardly passes through the anodized film 102.

Figure 1B:
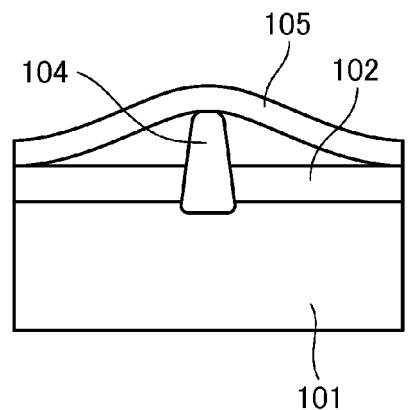

In other words, assuming that the aluminum carbide 103 (see FIGS. 1A, 1B and 2) present in the vicinity of the surface of the aluminum 101 has not grown as the aluminum hydroxide 104 (see the same figures) and remains intact, moisture fed afterwards hardly reach the aluminum carbide 103.

In consequence, the aluminum carbide 103 is prevented from growing as the aluminum hydroxide 104 and pushing up thereby the photosensitive layer 105 in time, which further suppresses formation of bulges causing image dropouts.

A larger value of the ratio (h/d) between the mean height (h) of the boehmite protrusions 107 and the mean pore diameter (d) of the micropore 106 indicates that the micropore 106 is sealed with the boehmite protrusions 107 more significantly, and formation of bulges causing image dropouts is suppressed more effectively.

Taking the above into account, the ratio (h/d) is preferably not less than 0.2, more preferably not less than 0.6, and even more preferably not less than 0.8.

In this regard, "the mean pore diameter" refers to the mean of pore diameters (d) of a single micropore 106, and "the mean height" refers to the mean of heights (h) of a plurality of boehmite protrusions 107 with which the micropore 106 in question is sealed.

The mean pore diameter (d) of the micropore 106 and the mean height (h) of the boehmite protrusions 107 may be found by observing a cross section prepared in any manner (cutting, bending with use of a jig) under a scanning electron microscope (SEM) at a magnification of 250,000×, and analyzing a cross-sectional image obtained.

Also on the anodized film 102, boehmite protrusions (not shown) causing scumming may be generated by the hydration reaction between aluminum oxide and water, and grow in the direction of height (upward in the drawing plane of FIG. 6).

In the lithographic printing plate support of the present invention, however, boehmite protrusions optionally generated on an anodized film have a smaller mean height of less than 15 nm and, moreover, their generation in itself is relatively small in amount. In other words, generation of boehmite protrusions on the anodized film 102 as a cause of scumming is suppressed in the present invention, so that a lithographic printing plate exhibiting a high resistance to scumming is obtained.

It is preferable for a further improved scumming resistance that the mean height of boehmite protrusions on the anodized film 102 is not more than 6 nm, whereupon the most preferred is that the anodized film 102 has substantially no boehmite protrusions thereon.

The mean height of boehmite protrusions on the anodized film 102 may be determined using an SEM in the same way as the mean height (h) of the boehmite protrusions 107.

The reason why boehmite protrusions on the anodized film 102 of the lithographic printing plate support of the present invention have a smaller mean height of less than 15 nm may be explained as follows.

At the beginning of the water vapor treatment as described before, that is to say, as soon as the aluminum plate enters the zone (e.g., box) where the water vapor treatment is to be conducted, condensation is expected to occur due to the temperature difference between the aluminum plate and the water vapor. Condensed water on the surface of the anodized film 102 is deemed to be removed by the drying effect of the water vapor at a temperature not lower than 130° C. (so-called superheated steam) used for the water vapor treatment, with generation of boehmite protrusions on the anodized film 102 being thus suppressed.

It is considered that condensed water is removed from the surface of the anodized film 102, but not from the inside of the micropore 106, which suggests the reason why the boehmite protrusions 107 are generated in the micropore 106 as described above.

<Presensitized Plate>

The lithographic printing plate support of the present invention can be made into a presensitized plate by providing an image recording layer, such as a photosensitive layer and a thermosensitive layer, on the support. No particular limitation is imposed on the image recording layer, and examples include those of conventional positive-working type, conventional negative-working type, photopolymer type, thermal positive-working type, thermal negative-working type, and on-press-developable, non-processed type as described in paragraphs [0042] through [0198] of JP 2003-1956 A.

The presensitized plate of the present invention preferably has a photosensitive layer provided on the lithographic printing plate support of the present invention, with the photosensitive layer containing (A) a sensitizing dye, (B) a polymerization initiator, (C) a polymerizable compound, and (D) a binder polymer, and more preferably has a protective layer provided on the photosensitive layer.

In the following, the presensitized plate of the present invention is described in detail.

<Photosensitive Layer>

(A) Sensitizing Dye

The photosensitive layer of the presensitized plate of the present invention contains a sensitizing dye in response to the wavelength of the light from a light source for exposure. The sensitizing dye may have an absorption maximum in the wavelength region ranging from 350 to 450 nm and, in that case, is exemplified by merocyanine dyes, benzopyrans, coumarins, aromatic ketones, and anthracenes. The sensitizing dyes as described in paragraphs [0019] through [0056] of JP 2008-46528 A and so forth are mentioned as specific examples of usable sensitizing dyes.

Details on the use of a sensitizing dye, such as the structure of the dye to be used, the way of usage, that is to say, the use of either a single dye or a combination of two or more dyes, and the amount of a dye added, are specified as appropriate.

In the case of a lithographic printing plate with a relatively small thickness, it is preferable to specify the amount of a sensitizing dye added so that the absorbance of the photosensitive layer may be 0.1 to 1.5, preferably 0.25 to 1. In general, the sensitizing dye as added preferably comprises 0.05 to 30% by weight, more preferably 0.1 to 20% by weight, and most preferably 0.2 to 10% by weight of the total solids in the photosensitive layer.

(B) Polymerization Initiator

Usable polymerization initiators include trihalomethyl compounds, carbonyl compounds, organic peroxides, azo compounds, azido compounds, metallocene compounds, hexaaryl biimidazole compounds, organoboron compounds, disulfone compounds, oxime ester compounds, and onium salt compounds. Among others, at least one selected from the group consisting of hexaaryl biimidazole compounds, onium salts, trihalomethyl compounds and metallocene compounds is preferably used, with hexaaryl biimidazole compounds being particularly preferred.

The polymerization initiators as described in paragraphs [0060] through [0067] of JP 2008-46528 A and so forth are mentioned as specific examples of usable polymerization initiators.

A polymerization initiator suitably used in the photosensitive layer may optionally be a single initiator or a combination of two or more initiators.

The polymerization initiator as used in the photosensitive layer preferably comprises 0.01 to 20% by weight, more preferably 0.1 to 15% by weight, and even more preferably 1.0 to 10% by weight of the total solids in the photosensitive layer.

(C) Polymerizable Compound

The polymerizable compound to be contained in the photosensitive layer is an addition-polymerizable compound having at least one ethylenically unsaturated double bond, and is selected from among compounds having at least one, preferably at least two terminal, ethylenically unsaturated bonds. Such compounds are widely known in the technical field of the present invention, and are usable without any particular limitation. They take chemical forms including the forms of a monomer, a prepolymer, namely dimer, trimer or oligomer, a mixture thereof, and a copolymer thereof. Exemplary monomers include unsaturated carboxylic acids (e.g., acrylic acid, methacrylic acid, itaconic acid, crotonic acid, isocrotonic acid, maleic acid) as well as esters and amides thereof, with an ester from an unsaturated carboxylic acid and an aliphatic polyhydric alcohol compound, and an amide from an unsaturated carboxylic acid and an aliphatic polyvalent amine compound being suitable for use. Also suitable for use are a product of the addition reaction of an unsaturated carboxylic acid ester or amide having a hydroxy group or a nucleophilic substituent such as an amino group and a mercapto group with a monofunctional or multifunctional isocyanate or epoxy, and a product of the dehydration condensation reaction of the above ester or amide with a monofunctional or multifunctional carboxylic acid. In addition, a product of the addition reaction of an unsaturated carboxylic acid ester or amide having an electrophilic substituent such as an isocyanato group and an epoxy group with a monofunctional or multifunctional alcohol, amine or thiol, and a product of the substitution reaction of an unsaturated carboxylic acid ester or amide having an eliminable substituent such as a halogen group and a tosyloxy group with a monofunctional or multifunctional alcohol, amine or thiol are suitable. The compounds in each of which the unsaturated carboxylic acid as above is replaced by an unsaturated phosphonic acid, styrene, vinyl ether or the like are also usable.

The polymerizable compounds as described in paragraphs [0070] through [0078] of JP 2008-46528 A and so forth are mentioned as specific examples of usable polymerizable compounds.

Details on the use of a polymerizable compound, such as the structure of the compound to be used, the way of usage, that is to say, the use of either a single compound or a combination of compounds, and the amount of a compound added, are specified as appropriate to the performance design for a final presensitized plate.

The polymerizable compound as used in the photosensitive layer preferably comprises 5 to 80% by weight, more preferably 25 to 75% by weight, of the total solids in the photosensitive layer. The polymerizable compound may optionally be a single compound or a combination of two or more compounds.

(D) Binder Polymer

An organic high polymer soluble in or swellable with an alkaline water is used as a binder polymer because the binder polymer to be contained in the photosensitive layer as a film forming agent should at the same time be dissolved in an alkaline developer solution. The binder polymer as a polymer soluble in or swellable with an alkaline water is removed during development with an alkaline developer, and application of pressure by brushing as required.

The binder polymer to be used is a binder polymer having the structural units as represented by the following formulae (1) through (3).

[Chemical Formula 1]

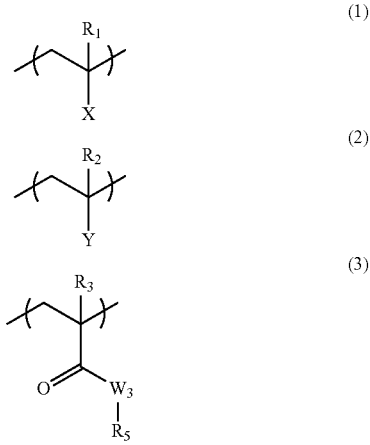

In the formulae, $R_1$ and $R_2$ are each independently a hydrogen atom or an alkyl group with a carbon number of 1 to 6; $R_3$ is a hydrogen atom, an alkyl group with a carbon number of 1 to 6, or an alkyl group with a carbon number of 1 to 6 substituted with a hydroxy group, a halogen atom, an amino group, a methoxy group or a carboxy group; X is a functional group selected from among —COOH, —CO—$W_1$-$L_1$-COOH and —$SO_3H$, where $W_1$ is an oxygen atom, a sulfur atom or —NH— group, and $L_1$ is a divalent organic group; Y is —CO—O—$CH_2$—CH=$CH_2$ group or —CO—$W_2$-$L_2$-O—CO—$CR_4$=$CH_2$ group, where $W_2$ is an oxygen atom, a sulfur atom or —NH— group, $L_2$ is a divalent organic group, and $R_4$ is a hydrogen atom or an alkyl group with a carbon number of 1 to 6; $W_3$ is an oxygen atom, a sulfur atom or —NH— group; and $R_5$ is an alkyl group with a carbon number of 1 to 18, an alkyl group having an alicyclic structure with a carbon number of 5 to 20, or a group having an aromatic ring with a carbon number of 6 to 20.

The binder polymers as described in paragraphs [0085] through [0090] of JP 2008-46528 A and so forth are mentioned as specific examples of the above binder polymer.

Preferably, the binder polymer to be used has appropriate molecular weight and acid value, whereupon a high polymer having a weight-average molecular weight of 5000 to 300,000 and an acid value of 0.5 to 200 is particularly preferred. The acid value refers to the number of milligrams of potassium hydroxide required for the neutralization of free fatty acids contained in one gram of sample. More preferable acid values fall within the range of 5.0 to 180, with an acid value of 10 to 150 being even more preferable.

The ratio by weight of the total amount of the structural units as represented by formulae (1) and (3), respectively, to the amount of the structural unit as represented by formula (2) which has an ethylenically unsaturated double bond is preferably 0.1 to 3.0, more preferably 0.1 to 2.0, and most preferably 0.1 to 1.0.

The structural units as represented by formulae (1) through (3) may be mixed together at any ratio as long as the ratio in question meets a molecular weight, an acid value and a double bond amount falling within their respective ranges as above. As long as the molecular weight, the acid value and the double bond amount are kept within their respective ranges as above, other structural unit than those represented by formulae (1) through (3) may be added.

The binder polymer may be contained in the photosensitive layer in any amount, while the binder polymer content is generally specified to be not more than 90% by weight, preferably 10 to 90% by weight, and more preferably 30 to 80% by weight, taking account of the strength of images formed, and so forth.

It is also possible to use other polymer soluble in or swellable with an alkaline water than that described above, or use the polymer as described above by mixing with other polymer.

While other organic high polymer soluble in or swellable with an alkaline water is exemplified by various polymers, a water-soluble organic high polymer may be used if development is to be carried out with water. Examples of the water-soluble organic high polymer include an addition polymer having a carboxylic acid group on a side chain, such as are described in paragraph [0093] of JP 2008-46528 A.

In order to ensure the developability of the photosensitive layer, it is preferable that the binder polymer to be used has appropriate molecular weight and acid value, whereupon a high polymer having a weight-average molecular weight of 5000 to 300,000 and an acid value of 20 to 200 is particularly preferred.

(E) Mercapto Compound

It is preferred to make the photosensitive layer contain a mercapto compound having a mercapto group because the compound is effective at enhancing the sensitivity. The mercapto compounds as described in paragraphs [0096] through [0102] of JP 2008-46528 A, paragraphs [0078] through [0086] of JP 2008-89788 A, and the like are mentioned as examples of usable mercapto compounds.

The mercapto compound as added generally comprises 0.5 to 20% by weight, preferably 1 to 15% by weight, and more preferably 1 to 10% by weight of the whole constituents of the photosensitive layer.

(F) Other Additives

It is desirable that a small amount of thermal polymerization inhibitor is added in order to prevent unwanted thermal polymerization in the photosensitive layer during the manufacture or storage of a presensitized plate. Suitable thermal polymerization inhibitors include those described in paragraph [0103] of JP 2008-46528 A.

The thermal polymerization inhibitor as added preferably comprises about 0.01% to about 5% by weight of the total solids as constituents of the photosensitive layer.

Behenic acid, behenic acid amide, or other higher fatty acid derivative may be added as required to make it present exclusively on the surface of the photosensitive layer being dried after coating, in order to prevent oxygen from inhibiting polymerization. The higher fatty acid derivative or the like as added preferably comprises about 0.5% to about 10% by weight of the total solids as constituents of the photosensitive layer.

A colorant may also be added for the coloring of the photosensitive layer. Exemplary colorants include those described in paragraph [0103] of JP 2008-46528 A. The colorant as added preferably comprises about 0.5% to about 20% by weight of the total solids in the photosensitive layer. In addition, such an additive as an inorganic filler and a plasticizer, with the latter being exemplified by dioctyl phthalate, dimethyl phthalate and tricresyl phosphate, may be added for the improvement of the cured layer in physical properties. The additive for physical property improvement as added preferably comprises not more than 10% by weight of the total solids in the photosensitive layer.

If exposure is to be carried out using a laser emitting in the blue to ultraviolet spectral region, especially at 350 to 450 nm, it is preferable to add a yellow dye or pigment. Suitable yellow dyes and pigments include the dyes as described in paragraph [0119] of JP 2008-89788 A.

<Formation of Photosensitive Layer>

During the coating process for forming a photosensitive layer, the components as described above are dissolved in a solvent to prepare a coating solution. The solvent to be used may be an organic solvent, with specific examples including those described in paragraph [0104] of JP 2008-46528 A. The solvent may optionally be a single solvent or a solvent mixture.

The solid concentration of the coating solution is generally 1 to 50% by weight.

A surfactant may be added to the coating solution in order to improve the quality of a coated surface.

The amount of the photosensitive layer as a coating film that is to be measured as the weight after drying is generally about 0.1 g to about 10 g/m$^2$, with amounts of 0.3 to 5 g/m$^2$ being preferred, and amounts of 0.5 to 3 g/m$^2$ being more preferred.

<Protective Layer>

The protective layer as mentioned before preferably contains a water-soluble resin. The protective layer also serves as an oxygen blocking layer for blocking diffusive intrusion of oxygen inhibiting the polymerization reaction during exposure. The oxygen permeability A of the protective layer as measured at 25° C. under a pressure of one atmosphere preferably falls within the range of 1.0≤A≤20 (mL/m$^2$·day). With an extremely low oxygen permeability A of less than 1.0 (mL/m$^2$·day), unwanted polymerization reaction may occur during the manufacture or storage of an unexposed presensitized plate, or unwanted fogging or thickening of image lines may occur during imagewise exposure. On the other hand, too high an oxygen permeability A over 20 (mL/m$^2$·day) may reduce the sensitivity. Oxygen permeabilities A ranging from 1.5 to 12 (mL/m$^2$·day) are more preferable, and those ranging from 2.0 to 8.0 (mL/m$^2$·day) are even more preferable. In addition to having an oxygen permeability falling within the range as above, a desired protective layer is essentially transparent to the light for exposure, has a good adhesion to the photosensitive layer, and is readily removable during a developing process following exposure. Efforts have been made to obtain such a protective layer, as described in detail in U.S. Pat. No. 3,458,311 and JP 55-49729 B.

A water-soluble high-molecular compound of relatively high crystallinity, for instance, is preferably used for the protective layer, with specific examples thereof including those described in paragraph [0108] of JP 2008-46528 A which may be used alone or in combination. Among others, use of polyvinyl alcohol as a chief component is most effective at obtaining a protective layer excellent in fundamental properties such as oxygen blocking property and removability upon development.

The polyvinyl alcohol to be used for the protective layer may partially be substituted with an ester, ether or acetal as long as it contains non-substituted vinyl alcohol units imparting to it required oxygen blocking property and water solubility. It is also possible that part of the polyvinyl alcohol contains other monomer than vinyl alcohol as a copolymerizable component. A typical polyvinyl alcohol may have a hydrolysis rate of 71 to 100 mol % and contain 300 to 2400 polymerized repeating units. Specific examples of the polyvinyl alcohol include those described in paragraph [0109] of JP 2008-46528 A which may be used alone or in combination. In a preferred embodiment, the content of the polyvinyl alcohol in the protective layer is 20 to 95% by weight, with a content of 30 to 90% by weight being more preferred.

Polyvinyl pyrrolidone or a modified polyvinyl pyrrolidone is suitable for use as a component mixed with the polyvinyl alcohol from the viewpoint of the oxygen blocking property, the removability upon development, and so forth. The content of polyvinyl pyrrolidone or a modified polyvinyl pyrrolidone in the protective layer is 3.5 to 80% by weight, preferably 10 to 60% by weight, and more preferably 15 to 30% by weight.

Components of the protective layer (that is to say, whether or not PVA, a given additive or the like is to be used as a component), the amount of the protective layer as a coating film, and so forth are determined taking account of not only the oxygen blocking property and the removability upon development but the risk of causing fogging, the adhesion and the scratch resistance. In general, a higher oxygen blocking property and, accordingly, a more desirable sensitivity are attained as PVA used has a higher hydrolysis rate (the content of non-substituted vinyl alcohol units in the protective layer is higher) and the protective layer has a larger thickness. The high-molecular compound to be used, such as the above polyvinyl alcohol (PVA), may have a molecular weight of 2000 to 10,000,000, whereupon a compound with a molecular weight of 20,000 to 3,000,000 is suitably used.

Glycerin, dipropylene glycol or the like may be added as another constituent of the protective layer in an amount equivalent to several percent by weight on the amount of a high-molecular compound used, so as to make the layer flexible. It is also possible to add an anionic surfactant such as sodium alkyl sulfates and sodium alkyl sulfonates; an ampholytic surfactant such as alkyl aminocarboxylate salts and alkyl aminodicarbosylte salts; or a nonionic surfactant such as polyoxyethylene alkyl phenyl ethers in an amount of several percent by weight on the amount of a high-molecular compound used. The protective layer suitably has a thickness of 0.5 to 5 μm, with a thickness of 1 to 3 μm being particularly suitable.

The adhesion to the photosensitive layer and the scratch resistance are also very important from the viewpoint of handling a presensitized plate. If a hydrophilic layer made of a water-soluble polymer is formed on the photosensitive layer which is lipophilic, the layers are liable to be separated from each other due to a poor adhesion, so that oxygen intruding between the separated layers inhibits polymerization to cause such defects as an inadequate curing of the photosensitive layer. Various proposals have been offered in order to improve the adhesion between the two layers. For instance, it is described in the US patent applications with Ser. Nos. 292, 501 and 44,563 that an acrylic emulsion, a water-insoluble vinyl pyrrolidone-vinyl acetate copolymer or the like is mixed into a hydrophilic polymer chiefly composed of polyvinyl alcohol in an amount of 20 to 60% by weight, and the resultant mixture is applied to a photosensitive layer to form another layer thereon, so as to attain an adequate adhesion between the layers. A coating process for forming such a protective layer as described above is described in detail in U.S. Pat. No. 3,458,311 or JP 55-49729 B, for instance.

The amount of the protective layer as a coating film is generally 0.1 g to 10 g/m$^2$, preferably 0.5 to 5 g/m$^2$, on dry weight basis.

<Undercoat>

The presensitized plate of the present invention may have an undercoat provided between the lithographic printing plate support of the present invention and the photosensitive layer a described before.

The compounds as described in paragraphs [0023] through [0026] of JP 2006-259536 A, paragraphs [0124] through [0158] of JP 2008-46528 A, and so forth are usable for the undercoat, whereupon the organic undercoat as described in paragraphs [0024] and [0025] of JP 2006-259536 A is suitable for use.

The amount of the undercoat as a coating film is preferably 2 to 1000 mg/m$^2$, more preferably 5 to 200 mg/m$^2$, and most preferably 10 to 50 mg/m$^2$. While various techniques are applicable to the formation of the undercoat on the support, the most preferred for the achievement of an amount of the undercoat falling within the above range is the technique in which a solution for forming the undercoat is prepared, applied onto the support, then dried.

<Back Coat>

After the support is subjected to surface treatment, or the undercoat is formed, a back coat may be provided on the back side of the support as required.

The back coat is suitably exemplified by a coating layer composed of the metal oxide which is obtained by the hydrolysis and polycondensation of the organic high-molecular compound as disclosed in JP 5-45885 A or the organic or inorganic metal compound as disclosed in JP 6-35174 A. Use of an alkoxy compound of silicon, such as $Si(OCH_3)_4$, $Si(OC_2H_5)_4$, $Si(OC_3H_7)_4$ and $Si(OC_4H_9)_4$, is particularly preferred because such a compound is low in cost and readily available.

<Platemaking>

A lithographic printing plate is prepared by subjecting the presensitized plate of the present invention to imagewise exposure and developing treatment. In developing treatment, development may be carried out using a developer solution.

<Developer Solution>

The developer solution to be used is not particularly limited, whereupon an aqueous solution containing an inorganic alkali salt and a surfactant, and generally having a pH of 11.0 to 12.7 may suitably be used.

The inorganic alkali salt to be used is selected as appropriate, and exemplified by the inorganic alkali salts as described in paragraph [0162] of JP 2008-46528 A which may be used alone or in combination of two or more out of them.

If a silicate is to be used, the developing capacity of the developer solution is readily controlled by modifying the mixing ratio between silicon oxide $SiO_2$ and alkali oxide $M_2O$ (M is an alkali metal or ammonium group) as ingredients of the silicate, and their concentrations. The aqueous alkali solution as above preferably has a mixing ratio between silicon oxide $SiO_2$ and alkali oxide $M_2O$ ($SiO_2/M_2O$; molar ratio) of 0.5 to 3.0, more preferably of 1.0 to 2.0. The $SiO_2$ and $M_2O$ as added preferably comprise 1 to 10% by weight, more preferably 3 to 8% by weight, and most preferably 4 to 7% by weight of the aqueous alkali solution. Under such concentrations, no reduction in developing or processing capacity occurs, no precipitates or crystals are generated, and, moreover, no gelation is observed during the neutralization when a waste solution is discarded, that is to say, liquid waste disposal is carried out without trouble.

An organic alkali agent may additionally be used for a delicate adjustment of the alkali concentration or improvement in solubility of the photosensitive layer. Usable organic alkali agents include those described in paragraph [0164] of JP 2008-46528 A which may be used alone or in combination of two or more out of them.

The surfactant to be used is selected as appropriate, and exemplified by the surfactants as described in paragraph [0165] of JP 2008-46528 A. A nonionic surfactant having a polyoxyalkylene ether group is particularly preferred.

The nonionic surfactants each having a polyoxyalkylene ether group as described in paragraphs [0167] through [0171] of JP 2008-46528 A are suitable for use.

The surfactant may optionally be a single surfactant or a combination of surfactants.

The pH of the developer solution is generally 11.0 to 12.7, preferably 11.5 to 12.5, lest image areas or exposed areas be damaged during development.

The conductivity of the developer solution is preferably 3 to 30 mS/cm, and more preferably 5 to 20 mS/cm.

<Exposure and Developing Treatment>

An image may be formed on the surface of an aluminum plate as a support by subjecting the presensitized plate of the present invention to imagewise exposure with actinic light from a conventional light source, such as a carbon arc lamp, a high-pressure mercury-vapor lamp, a xenon lamp, a metal halide lamp, a fluorescent lamp, a tungsten lamp, a halogen lamp, a helium-cadmium laser, an argon ion laser, an FD-YAG laser, a helium-neon laser and a semiconductor laser (350 to 600 nm), then developing treatment with a developer solution. The light source for exposure is preferably a laser emitting at 350 to 600 nm.

Between the imagewise exposure and the development, heating at a temperature of 50 to 140° C. for one second to five minutes may be performed in order to increase the efficiency of photosensitive layer curing. Heating at a temperature falling within the above range is effective for the increase in efficiency of photosensitive layer curing with no layer residues due to dark polymerization in non-exposed areas.

If a protective layer has been provided on the photosensitive layer of the presensitized plate of the present invention, the protective layer may be removed in a known manner, that is to say, removed with the developer solution concurrently with the removal of non-exposed areas of the photosensitive layer, or alternatively, removed with water or hot water before the removal of non-exposed areas of the photosensitive layer by development. In the latter case, the antiseptic or the like as disclosed in JP 10-10754 A, or the organic solvent or the like as disclosed in JP 8-278636 A may be contained in the water or hot water.

The developer solution to be used for the developing treatment conducted on the presensitized plate of the present invention preferably contains a nonionic surfactant having a polyoxyalkylene ether group.

The development with the developer solution as described above is performed on the presensitized plate of the present invention at a temperature of 0 to 60° C., preferably about 15 to 40° C., by following a routine procedure such that, for instance, the presensitized plate after exposure is immersed in the developer solution and as such scrubbed with a brush.

If developing treatment is to be conducted on an automatic processor, the developer solution decreases in processing capacity as the throughput is increased. The processing capacity may be restored by adding the developer solution or replacing the developer solution by a fresh one. After developing treatment, the presensitized plate is generally subjected to post-treatment with rinsing water, a rinsing solution containing a surfactant and so forth, or a desensitizer solution containing gum arabic, a starch derivative or the like, as described in JP 54-8002 A, JP 55-115045 A, JP 59-58431 A, and so forth. In the present invention, various treatments may be used in combination for the post-treatment to be conducted on the presensitized plate.

A printing plate resulting from the treatments as described above may be improved in press life by subjecting it to post-exposure treatment based on the method as disclosed in JP 2000-89478 A, or heating treatment such as burning.

The lithographic printing plate thus prepared is mounted on an offset press to make a large number of printed sheets.

EXAMPLES

Examples 1 Through 43, and Comparative Examples 1 Through 3

The present invention is illustrated by way of the following examples, to which the present invention is in no way limited.

<Manufacture of Lithographic Printing Plate Support>

<Aluminum Plate>

The 0.24 mm thick plates of aluminum alloy of quality 1S which had different aluminum carbide concentrations were each subjected to one of the graining treatments (A) through (C) as described below, with the relevant treatment being seen from Table 1 as shown later, then anodizing treatment, optional preapplying treatment, and water vapor treatment to manufacture a lithographic printing plate support.

The aluminum carbide concentrations as set forth in Table 1 were determined by gas chromatography (compliant with Light Metal Industrial Standard LIS-A07-1971). Between treatment processes, rinsing treatment with water was indispensably conducted, and liquid was removed with nip rollers at the end of each rinsing treatment.

<Graining Treatment (A)>

(A-a) Alkali Etching Treatment.

An aluminum plate was subjected to etching treatment by spraying the plate with an aqueous solution of caustic soda having a caustic soda concentration of 26% by weight, an aluminum ion concentration of 6.5% by weight and a temperature of 70° C. from a spray line. After the treatment, the aluminum plate was sprayed with water for rinsing. The amount of aluminum dissolved away from the plate surface to be subjected to electrochemical graining treatment was 5 g/m².

(A-b) Desmutting Treatment in an Aqueous Acid Solution.

Desmutting treatment was then conducted in an aqueous nitric acid solution. The aqueous nitric acid solution used for the desmutting treatment was the waste from the aqueous nitric acid solution as used in the next step of electrochemical graining. The solution temperature was 35° C. Desmutting by spraying with a desmutting solution was performed for three seconds.

(A-c) Electrochemical Graining Treatment.

By electrolysis in a nitric acid-containing solution using alternating voltage at 60 Hz, electrochemical graining treatment was continuously conducted on the aluminum plate. The electrolyte solution for the treatment was prepared by adding aluminum nitrate to a 10.4 g/L aqueous solution of nitric acid at 35° C. to make the solution have an aluminum ion concentration of 4.5 g/L. The AC source waveform was as shown in FIG. 3, that is to say, an alternating current of trapezoidal waveform was employed for the electrochemical graining treatment on conditions that the time tp for the transition of current value from zero to peak was 0.8 msec and the duty ratio was 1:1. A carbon electrode was used as a counter electrode, and ferrite was used for an auxiliary anode. The electrolytic cell was as shown in FIG. 4. The current density was 30 A/dm$^2$ at current peaks, and the current from a power source was shunted into the auxiliary anode at a ratio of 5%. The amount of electricity was 250 C/dm$^2$ as the total amount of electricity when the aluminum plate served as an anode. After the treatment, the aluminum plate was sprayed with water for rinsing.

(A-d) Alkali Etching Treatment.

The aluminum plate thus obtained was subjected to etching treatment by spraying the plate with an aqueous solution of caustic soda having a caustic soda concentration of 5% by weight, an aluminum ion concentration of 0.5% by weight and a temperature of 50° C. from a spray line. After the treatment, the aluminum plate was sprayed with water for rinsing. The amount of aluminum dissolved away was 0.2 g/m$^2$.

(A-e) Desmutting Treatment in an Aqueous Acid Solution.

Using a waste solution generated in the anodizing treatment process (170 g/L aqueous solution of sulfuric acid with 5 g/L aluminum ions dissolved therein), desmutting treatment was conducted at a solution temperature of 35° C. for four seconds. Desmutting by spraying with a desmutting solution was performed for three seconds.

<Graining Treatment (B)>

(B-a) Alkali Etching Treatment.

An aluminum plate was subjected to etching treatment by spraying the plate with an aqueous solution of caustic soda having a caustic soda concentration of 26% by weight, an aluminum ion concentration of 6.5% by weight and a temperature of 70° C. from a spray line. After the treatment, the aluminum plate was sprayed with water for rinsing. The amount of aluminum dissolved away from the plate surface to be subjected to electrochemical graining treatment was 1.0 g/m$^2$.

(B-b) Desmutting Treatment in an Aqueous Acid Solution (First Desmutting Treatment).

Desmutting treatment was then conducted in an aqueous acid solution. The aqueous acid solution used for the desmutting treatment was a 150 g/L aqueous solution of sulfuric acid. The solution temperature was 30° C. Desmutting by spraying with a desmutting solution was performed for three seconds. After the treatment, the aluminum plate was rinsed with water.

(B-c) Electrochemical Graining Treatment in an Aqueous Hydrochloric Acid Solution.

Subsequently, electrolytic graining treatment with alternating current was conducted on the aluminum plate using an electrolyte solution having a hydrochloric acid concentration of 14 g/L, an aluminum ion concentration of 13 g/L and a sulfuric acid concentration of 3 g/L. The temperature of the electrolyte solution was 30° C. The aluminum ion concentration was adjusted by addition of aluminum chloride.

The alternating current as used had a sinusoidal waveform, with the positive and negative waveforms therein being symmetrical to each other, and a frequency of 50 Hz, whereupon the time for anodic reaction and the time for cathodic reaction in one cycle of the alternating current were such that the ratio between them was 1:1, and the current density was 75 A/dm$^2$ at peaks of the alternating current waveform. The amount of electricity was 450 C/dm$^2$ as the total amount of electricity used for the anodic reaction on the aluminum plate. Electrolysis was carried out by applying 125 C/dm$^2$ of electricity four times at intervals of four seconds. A carbon electrode was used as a counter electrode opposite to the aluminum plate. After the treatment, the aluminum plate was rinsed with water.

(B-d) Alkali Etching Treatment.

The aluminum plate after the electrochemical graining treatment was subjected to etching treatment by spraying the plate with an aqueous solution of caustic soda having a caustic soda concentration of 5% by weight, an aluminum ion concentration of 0.5% by weight and a temperature of 35° C. from a spray line. The amount of aluminum dissolved away from the plate surface as subjected to electrochemical graining treatment was 0.1 g/m$^2$. After the treatment, the aluminum plate was rinsed with water.

(B-e) Desmutting Treatment in an Aqueous Acid Solution.

Finally, desmutting treatment was conducted in an aqueous acid solution. The aqueous acid solution used for the desmutting treatment was a waste solution generated in the anodizing treatment process (170 g/L aqueous solution of sulfuric acid with 5.0 g/L aluminum ions dissolved therein). The solution temperature was 30° C. Desmutting by spraying with a desmutting solution was performed for three seconds.

<Graining Treatment (C)>

(C-a) Mechanical Graining Treatment (Brush Graining).

Figure 5:
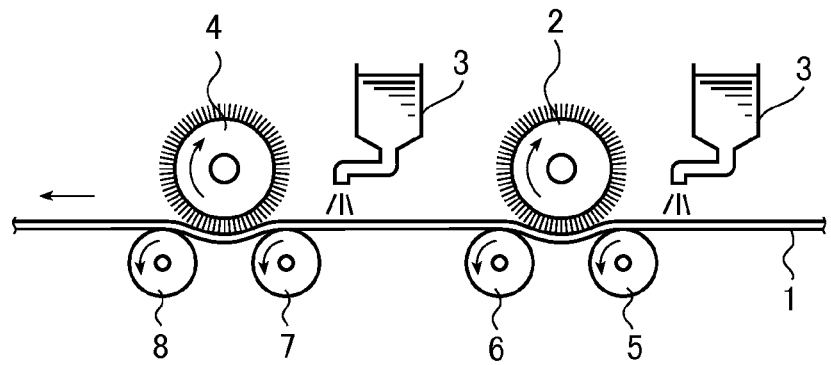
FIG. 5 is a schematic diagram showing the concept of a brush graining process employed in mechanical graining treatment conducted during the manufacture of the lithographic printing plate support of the present invention.

Using such equipment as shown in FIG. 5, mechanical graining treatment with rotating brush bristles was conducted on an aluminum plate while a pumice suspension (specific gravity, 1.1 g/cm$^2$) was fed onto the plate surface as an abrasive slurry. FIG. 5 shows an aluminum plate 1, roller brushes (namely, rollers having brush bristles set thereon) 2 and 4, an abrasive slurry 3, and support rollers 5, 6, 7 and 8.

In the mechanical graining treatment as conducted, the abrasive had a median diameter of 30 μm, the brushes were four in number, and the brush rotating speed was 250 rpm. The material for the brush bristles was nylon 6.10, the bristle diameter was 0.3 mm, and the bristle length was 50 mm. For each brush, the bristles were densely set in holes formed in a stainless steel cylinder having a diameter of 300 mm. The distance between two support rollers (each with a diameter of 200 mm) under each roller brush was 300 mm. The brush bristles were pressed against the aluminum plate to the extent that the load on a motor for rotatively driving the roller brushes was increased by 10 kW from that before the bristles were pressed against the aluminum plate. The brushes were rotated in the same direction as the direction in which the aluminum plate was moved.

(C-b) Alkali Etching Treatment.

The aluminum plate thus obtained was subjected to etching treatment by spraying the plate with an aqueous solution of caustic soda having a caustic soda concentration of 26% by weight, an aluminum ion concentration of 6.5% by weight and a temperature of 70° C. from a spray line. After the treatment, the aluminum plate was sprayed with water for rinsing. The amount of aluminum dissolved away was 10 g/m$^2$.

(C-c) Desmutting Treatment in an Aqueous Acid Solution.

Desmutting treatment was then conducted in an aqueous nitric acid solution. The aqueous nitric acid solution used for the desmutting treatment was the waste from the aqueous nitric acid solution as used in the next step of electrochemical graining. The solution temperature was 35° C. Desmutting by spraying with a desmutting solution was performed for three seconds.

(C-d) Electrochemical Graining Treatment.

By electrolysis in a nitric acid-containing solution using alternating voltage at 60 Hz, electrochemical graining treatment was continuously conducted on the aluminum plate. The electrolyte solution for the treatment was prepared by adding aluminum nitrate to a 10.4 g/L aqueous solution of nitric acid at 35° C. to make the solution have an aluminum ion concentration of 4.5 g/L. The AC source waveform was as shown in FIG. 3, that is to say, an alternating current of trapezoidal waveform was employed for the electrochemical graining treatment on conditions that the time tp for the transition of current value from zero to peak was 0.8 msec and the duty ratio was 1:1. A carbon electrode was used as a counter electrode, and ferrite was used for an auxiliary anode. The electrolytic cell was as shown in FIG. 4. The current density was 30 A/dm$^2$ at current peaks, and the current from a power source was shunted into the auxiliary anode at a ratio of 5%. The amount of electricity was 185 C/dm$^2$ as the total amount of electricity when the aluminum plate served as an anode. After the treatment, the aluminum plate was sprayed with water for rinsing.

(C-e) Alkali Etching Treatment.

The aluminum plate thus obtained was subjected to etching treatment by spraying the plate with an aqueous solution of caustic soda having a caustic soda concentration of 5% by weight, an aluminum ion concentration of 0.5% by weight and a temperature of 50° C. from a spray line. After the treatment, the aluminum plate was sprayed with water for rinsing. The amount of aluminum dissolved away was 0.5 g/m$^2$.

(C-f) Desmutting Treatment in an Aqueous Acid Solution.

Desmutting treatment was then conducted in an aqueous sulfuric acid solution. The aqueous sulfuric acid solution used for the desmutting treatment had a sulfuric acid concentration of 170 g/L and an aluminum ion concentration of 5 g/L. The solution temperature was 30° C. Desmutting by spraying with a desmutting solution was performed for three seconds.

(C-g) Electrochemical Graining Treatment.

By electrolysis in a hydrochloric acid-containing solution using alternating voltage at 60 Hz, electrochemical graining treatment was continuously conducted on the aluminum plate. The electrolyte solution for the treatment was prepared by adding aluminum chloride to a 6.2 g/L aqueous solution of hydrochloric acid at 35° C. to make the solution have an aluminum ion concentration of 4.5 g/L. The AC source waveform was as shown in FIG. 3, that is to say, an alternating current of trapezoidal waveform was employed for the electrochemical graining treatment on conditions that the time tp for the transition of current value from zero to peak was 0.8 msec and the duty ratio was 1:1. A carbon electrode was used as a counter electrode, and ferrite was used for an auxiliary anode. The electrolytic cell was as shown in FIG. 4.

The current density was 25 A/dm$^2$ at current peaks, and the amount of electricity used for the electrolysis in an aqueous hydrochloric acid solution was 63 C/dm$^2$ as the total amount of electricity when the aluminum plate served as an anode. After the treatment, the aluminum plate was sprayed with water for rinsing.

(C-h) Alkali Etching Treatment.

The aluminum plate thus obtained was subjected to etching treatment by spraying the plate with an aqueous solution of caustic soda having a caustic soda concentration of 5% by weight, an aluminum ion concentration of 0.5% by weight and a temperature of 50° C. from a spray line. After the treatment, the aluminum plate was sprayed with water for rinsing. The amount of aluminum dissolved away was 0.1 g/m$^2$.

(C-i) Desmutting Treatment in an Aqueous Acid Solution.

Using a waste solution generated in the anodizing treatment process (170 g/L aqueous solution of sulfuric acid with 5 g/L aluminum ions dissolved therein), desmutting treatment was conducted at a solution temperature of 35° C. for four seconds. Desmutting by spraying with a desmutting solution was performed for three seconds.

<Anodizing Treatment>

The aluminum plate as subjected to one of graining treatments (A) through (C) was then subjected to anodizing treatment in a 20 wt % aqueous solution of sulfuric acid at 33° C. for 50 seconds. Anodizing was carried out with a cathode positioned on a grained surface of the aluminum plate at a current density of 5 A/dm$^2$. The amount of anodized film formed was 2.6 g/m$^2$.

<Preapplying Treatment>

Preapplying treatment was optionally conducted after the anodizing treatment. Preapplication of water was carried out by roll coating. To be more specific: The aluminum plate as subjected to the anodizing treatment was dipped in pure water in a dipping tank, then caused to pass through a roll so as to adjust the amount of water applied. Amounts of water applied were as set forth in the column "Application amount [cc/m$^2$]" of Table 1 as shown later. The symbol "-" in the above column indicates that preapplying treatment was not conducted.

The amount of water applied, namely application amount, was adjusted by modifying conditions for a roll used (the touch roll diameter, the hardness of rubber, the touching width, the touching pressure, and the rubber layer thickness). The relationship between the application amount and the conditions for a roll used is set forth in Table 2 as shown later.

<Water Vapor Treatment>

Water vapor treatment was conducted on the aluminum plate after the above anodizing treatment (or preapplying treatment), with the treatment conditions, namely the water vapor temperature (in the column "Temperature [° C.]"), the treatment time (in the column "Time [s]") and the pressure condition (in the column "Pressure [atm]"), having been specified as set forth in Table 1 as shown later. In the treatment, the aluminum plate was introduced into a box filled with water vapor to bring the plate into contact with the vapor. The temperature and pressure of the water vapor were measured in the box. If the "Temperature," "Time," and "Pressure" for water vapor treatment are all set forth in the table as "-", it is indicated that water vapor treatment was not conducted on the relevant aluminum plate.

<Mean Height>

A cross section of each lithographic printing plate support manufactured as described above was observed under a scanning electron microscope (SEM; type S-4800 manufactured by Hitachi, Ltd.) at a magnification of 250,000×, and an SEM image obtained was analyzed to find the mean height [nm] of boehmite protrusions on the anodized film. The results are set forth in Table 1.

Ratio (h/d)

The SEM image as obtained in a similar manner to the above was analyzed to find the mean pore diameter (d) of a micropore formed in the anodized film and the mean height (h) of the boehmite protrusions with which the micropore in question was sealed, so as to determine the ratio (h/d) of the mean height (h) to the mean pore diameter (d). The results are set forth in Table 1.

The ratio (h/d) as set forth in Table 1 is the mean of the ratios (h/d) of any five micropores observed in the SEM image by viewing the cross section of the anodized film from the top to the bottom.

Manufacture of Presensitized Plate

Undercoat

The solution for forming undercoat whose compositional ratio is shown below was applied to each support using a bar coater so that the amount of an undercoat applied might be 2 mg/m² on dry weight basis, then dried at 80° C. for 20 seconds. Compositional Ratio of Solution for Forming Undercoat:

| | |
|---|---|
| Polymer (P1) | 0.3 parts by weight |
| Pure water | 60.0 parts by weight |
| Methanol | 939.7 parts by weight |

[Chemical Formula 2]

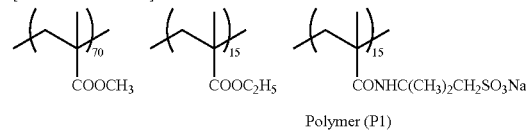

Polymer (P1)

Manufacture of Presensitized Plate

The photosensitive composition (1) whose compositional ratio is shown below was applied to each support using a bar coater, then dried at 90° C. for one minute to form a photosensitive layer. The amount of the photosensitive layer after drying was 1.35 g/m².

Compositional Ratio of Photosensitive Composition (1):

| | |
|---|---|
| Polymerizable compound (1) as below (PLEX 6661-O manufactured by Evonik Degussa Japan Co., Ltd.) | 1.69 parts by weight |
| Binder polymer (1) as below | 1.87 parts by weight |
| Sensitizing dye (1) as below | 0.13 parts by weight |
| Polymerization initiator (1) as below | 0.46 parts by weight |
| Chain transfer agent (1) as below | 0.44 parts by weight |
| Dispersion of ε-phthalocyanine pigment (15 parts by weight pigment; 10 parts by weight dispersant (allyl methacrylate-methacrylic acid copolymer with a weight-average molecular weight of 60,000 and a molar ratio of copolymerization of 83/17); 15 parts by weight cyclohexanone) | 1.70 parts by weight |
| Thermal polymerization inhibitor (N-nitrosophenyl hydroxylamine aluminum salt) | 0.012 parts by weight |
| Dispersion of yellow pigment (15 parts by weight Novoperm Yellow H2G (manufactured by Clariant Corp.) as yellow pigment; 10 parts by weight dispersant (allyl methacrylate-methacrylic acid copolymer with a weight-average molecular weight of 60,000 and a molar ratio of copolymerization of 83/17); 15 parts by weight cyclohexanone) | 0.5 parts by weight |
| Fluorochemical surfactant (1) as below (weight-average molecular weight, 10,000) | 0.03 parts by weight |
| Methyl ethyl ketone | 27.0 parts by weight |
| Propylene glycol monomethyl ether | 26.7 parts by weight |

[Chemical Formula 3]

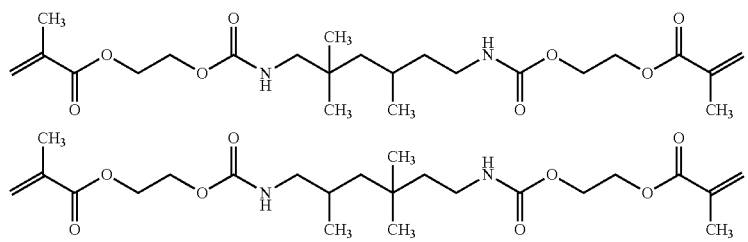

[Mixture of the above isomers]
Polymerizable compound (1)

[Chemical Formula 4]

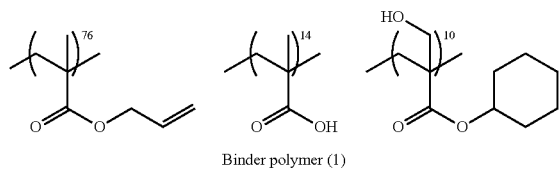

Binder polymer (1)

[Chemical Formula 5]

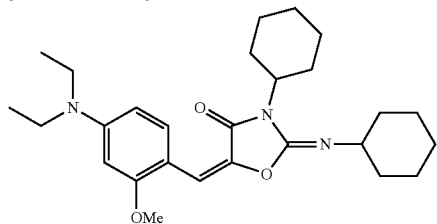

Sensitizing dye (1)

[Chemical Formula 6]

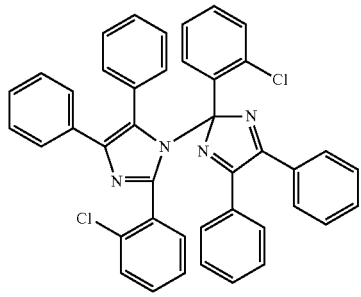

Polymerization initiator (1)

[Chemical Formula 7]

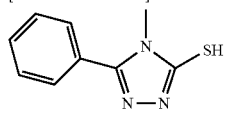

Cain transfer agent (1)

[Chemical Formula 8]

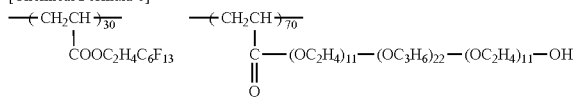

Fluorochemical surfactant (1)

Onto the photosensitive layer, the solution for applying protective layer whose compositional ratio is shown below was applied using a bar coater so that the amount of a protective layer applied might be 2.5 g/m² on dry weight basis, then dried at 120° C. for one minute to obtain a presensitized plate.
Compositional Ratio of Solution for Applying Protective Layer:

| | |
|---|---|
| PVA 105 (polyvinyl alcohol with a saponification rate of 98 mol % manufactured by KURARAY CO., LTD.) | 1.80 parts by weight |
| PVP-K30 (polyvinyl pyrrolidone manufactured by BASF Corp.) | 0.40 parts by weight |
| EMALEX 710 (manufactured by Nihon Emulsion Co., Ltd.) | 0.03 parts by weight |
| Luviskol VA 64W (manufactured by BASF Corp.) | 0.04 parts by weight |
| Polymer (1) as above | 0.05 parts by weight |
| Pure water | 36.5 parts by weight |

<Evaluation>
<Bulge>

The presensitized plate thus obtained was left standing for 30 days so as to make bulges (each with a diameter of about 100 μm) formed at the plate surface. The plate was then subjected to imagewise exposure on a CTP machine Vx9600 (light source wavelength, 405 nm), a product of FUJIFILM Corp., so regulated that the quantity of light for exposure might be 0.05 mJ/cm². Within 30 seconds after the exposure, development was performed on a PS processor InterPlater 850 HD manufactured by Glunz & Jensen Corp., whereupon the alkaline developer solution whose compositional ratio is shown below was charged in the processor and preheated to 25° C. before use.
Compositional Ratio of Alkaline Developer Solution:

| | |
|---|---|
| Potassium hydroxide | 0.15 g |
| Polyoxyethylene naphthyl ether (n = 13) | 5.0 g |
| CHELEST 400 (chelating agent) | 0.1 g |
| Water | 94.75 g |

After the development, the presensitized plate was evaluated with respect to the number of bulges indirectly by counting image dropouts (defects in aluminum) observed in an area of at least 400 cm². The evaluation results are set forth in Table 1. For the evaluation, the following criteria were employed.

A: 0 to 2 image dropouts per 400 cm²;
A': 3 to 5 image dropouts per 400 cm²;
B: 6 to 8 image dropouts per 400 cm²;
B': 9 to 11 image dropouts per 400 cm²;
C: 12 to 14 image dropouts per 400 cm²;
C': 15 to 17 image dropouts per 400 cm²;
D: 18 to 20 image dropouts per 400 cm²;

E: 21 to 25 image dropouts per 400 cm$^2$;
F: 26 to 30 image dropouts per 400 cm$^2$;
G: not less than 31 image dropouts per 400 cm$^2$.

It is preferable that bulges are lower in number because image dropouts are reduced accordingly. From a practical viewpoint, a presensitized plate should not be evaluated as rank F or G with respect to the number of bulges.

<Press Life>

The presensitized plate as obtained was subjected to imagewise exposure on a CTP machine Vx9600 (light source wavelength, 405 nm), a product of FUJIFILM Corp., so regulated that the quantity of light for exposure might be 0.05 mJ/cm$^2$. Within 30 seconds after the exposure, development was performed on a PS processor InterPlater 850 HD manufactured by Glunz & Jensen Corp., whereupon the alkaline developer solution whose compositional ratio is shown below was charged in the processor and preheated to 25° C. before use. With the lithographic printing plate thus prepared, printing was performed on a Lithrone printing press manufactured by Komori Corporation using black ink DIC-GEOS (N) available from DIC Corporation. The press life of the lithographic printing plate was evaluated by the number of the printed sheets which had already been made from the printing plate at the time when the density of solid images began to decline on visual inspection. The evaluation results are set forth in Table 1.

Compositional Ratio of Alkaline Developer Solution:

| Potassium hydroxide | 0.15 g |
| Polyoxyethylene naphthyl ether (n = 13) | 5.0 g |
| CHELEST 400 (chelating agent) | 0.1 g |
| Water | 94.75 g |

<Scumming Resistance>

The presensitized plate as obtained was subjected to imagewise exposure on a CTP machine Vx9600 (light source wavelength, 405 nm), a product of FUJIFILM Corp., so regulated that the quantity of light for exposure might be 0.05 mJ/cm$^2$. Within 30 seconds after the exposure, development was performed on a PS processor InterPlater 850 HD manufactured by Glunz & Jensen Corp., whereupon the alkaline developer solution whose compositional ratio is shown below was charged in the processor and preheated to 25° C. before use. It should be noted that the presensitized plates to be subjected to exposure and development were each excellent in sensitivity.

Compositional Ratio of Alkaline Developer Solution:

| Potassium hydroxide | 0.15 g |
| Polyoxyethylene naphthyl ether (n = 13) | 5.0 g |
| CHELEST 400 (chelating agent) | 0.1 g |
| Water | 94.75 g |

With the lithographic printing plate thus prepared, printing was performed on a printing press Mitsubishi DAIYA F2 (manufactured by Mitsubishi Heavy Industries, Ltd.) using red ink DIC-GEOS (s). After 10,000 printed sheets were made, the lithographic printing plate was evaluated with respect to the scumming resistance by visually inspecting stains on the blanket. The evaluation results are set forth in Table 1. For the evaluation, the following criteria were employed.

A: Almost no stains are on the blanket.
B: The blanket is stained indeed but to an acceptable extent.
C: The blanket is stained, and printed sheets are distinctly soiled.

From a practical viewpoint, a lithographic printing plate should not be evaluated as rank C.

TABLE 1

| | Aluminum carbide concentration [ppm] | Graining treatment | Application amount [cc/m$^2$] | Water vapor treatment Temperature [° C.] | Time [s] | Pressure [atm] | Mean height [nm] | h/d | Bulge | Evaluation Press life [thousand sheets] | Blanket scumming resistance |
|---|---|---|---|---|---|---|---|---|---|---|---|
| Example 1  | 2  | (A) | —   | 130 | 1  | 1 | 2.4  | 0.24 | E  | 100 | A |
| Example 2  | 2  | (A) | —   | 130 | 5  | 1 | 6.8  | 0.46 | D  | 100 | B |
| Example 3  | 2  | (A) | —   | 130 | 15 | 1 | 12.4 | 0.72 | C  | 100 | B |
| Example 4  | 2  | (A) | —   | 150 | 1  | 1 | 1.6  | 0.28 | E  | 100 | A |
| Example 5  | 2  | (A) | —   | 150 | 3  | 1 | 3.2  | 0.42 | D  | 100 | A |
| Example 6  | 2  | (A) | —   | 150 | 5  | 1 | 5.8  | 0.64 | C  | 100 | A |
| Example 7  | 2  | (A) | —   | 150 | 10 | 1 | 7.6  | 0.8  | B  | 100 | B |
| Example 8  | 2  | (A) | —   | 150 | 15 | 1 | 10.6 | 0.92 | B  | 100 | B |
| Example 9  | 2  | (A) | —   | 150 | 60 | 1 | 14.2 | 0.96 | A  | 100 | B |
| Example 10 | 2  | (A) | —   | 200 | 1  | 1 | 1.2  | 0.44 | D  | 100 | A |
| Example 11 | 2  | (A) | —   | 200 | 5  | 1 | 3.4  | 0.8  | B  | 100 | A |
| Example 12 | 2  | (A) | —   | 200 | 15 | 1 | 3.6  | 0.96 | A  | 100 | A |
| Example 13 | 5  | (A) | —   | 150 | 5  | 1 | 5.6  | 0.64 | D  | 100 | A |
| Example 14 | 15 | (A) | —   | 150 | 5  | 1 | 5.8  | 0.62 | E  | 100 | A |
| Example 15 | 2  | (B) | —   | 150 | 5  | 1 | 5.8  | 0.64 | C  | 100 | A |
| Example 16 | 2  | (C) | —   | 150 | 5  | 1 | 5.6  | 0.64 | C  | 100 | A |
| Example 17 | 2  | (A) | —   | 350 | 5  | 1 | 2.6  | 0.96 | A  | 100 | A |
| Example 18 | 2  | (A) | —   | 170 | 1  | 1 | 1.6  | 0.50 | E  | 100 | A |
| Example 19 | 2  | (A) | —   | 170 | 5  | 1 | 4.1  | 0.68 | C  | 100 | A |
| Example 20 | 2  | (A) | —   | 170 | 15 | 1 | 6.9  | 0.94 | B  | 100 | B |
| Example 21 | 2  | (A) | —   | 350 | 3  | 1 | 2.4  | 0.45 | D  | 100 | A |
| Example 22 | 2  | (A) | —   | 350 | 10 | 1 | 2.6  | 0.97 | A  | 100 | A |
| Example 23 | 2  | (A) | 0.5 | 130 | 5  | 1 | 2.4  | 0.46 | D  | 100 | A |
| Example 24 | 2  | (A) | 1   | 130 | 5  | 1 | 2.4  | 0.48 | C' | 100 | A |
| Example 25 | 2  | (A) | 3   | 130 | 5  | 1 | 2.5  | 0.54 | C  | 100 | A |
| Example 26 | 2  | (A) | 6   | 130 | 5  | 1 | 2.6  | 0.48 | C' | 100 | A |
| Example 27 | 2  | (A) | 10  | 130 | 5  | 1 | 2.6  | 0.42 | D  | 100 | A |

TABLE 1-continued

| | Aluminum carbide concentration [ppm] | Graining treatment | Application amount [cc/m²] | Water vapor treatment Temperature [° C.] | Time [s] | Pressure [atm] | Mean height [nm] | h/d | Bulge | Evaluation Press life [thousand sheets] | Blanket scumming resistance |
|---|---|---|---|---|---|---|---|---|---|---|---|
| Example 28 | 2 | (A) | 1 | 170 | 5 | 1 | 4.2 | 0.78 | B' | 100 | A |
| Example 29 | 2 | (A) | 3 | 170 | 5 | 1 | 4.2 | 0.88 | B | 100 | A |
| Example 30 | 2 | (A) | 6 | 170 | 5 | 1 | 4.3 | 0.80 | B' | 100 | A |
| Example 31 | 2 | (A) | 10 | 170 | 5 | 1 | 4.4 | 0.64 | C | 100 | A |
| Example 32 | 2 | (A) | 1 | 200 | 1 | 1 | 1.4 | 0.50 | C | 100 | A |
| Example 33 | 2 | (A) | 3 | 200 | 1 | 1 | 1.6 | 0.58 | C | 100 | A |
| Example 34 | 2 | (A) | 6 | 200 | 1 | 1 | 1.8 | 0.56 | C | 100 | A |
| Example 35 | 2 | (A) | 10 | 200 | 1 | 1 | 2.1 | 0.40 | D | 100 | A |
| Example 36 | 2 | (A) | 1 | 200 | 5 | 1 | 3.6 | 0.84 | A' | 100 | A |
| Example 37 | 2 | (A) | 3 | 200 | 5 | 1 | 4.0 | 0.92 | A | 100 | A |
| Example 38 | 2 | (A) | 6 | 200 | 5 | 1 | 4.2 | 0.86 | A' | 100 | A |
| Example 39 | 2 | (A) | 10 | 200 | 5 | 1 | 4.4 | 0.55 | C | 100 | A |
| Example 40 | 2 | (A) | 1 | 350 | 3 | 1 | 2.6 | 0.54 | C | 100 | A |
| Example 41 | 2 | (A) | 3 | 350 | 3 | 1 | 2.8 | 0.70 | C | 100 | A |
| Example 42 | 2 | (A) | 6 | 350 | 3 | 1 | 3.0 | 0.65 | C | 100 | A |
| Example 43 | 2 | (A) | 10 | 350 | 3 | 1 | 3.2 | 0.46 | D | 100 | A |
| Comparative Example 1 | 2 | (A) | — | — | — | — | 0 | 0 | G | 100 | A |
| Comparative Example 2 | 2 | (A) | — | 100 | 5 | 1 | 16.2 | 0.12 | F | 100 | C |
| Comparative Example 3 | 2 | (A) | — | 125 | 5 | 1 | 18.6 | 0.16 | F | 100 | C |

TABLE 2

| Application amount [cc/m²] | Touch roll diameter [mm] | Hardness of rubber [Shore A] | Touching width [mm] | Touching pressure [MPa] | Rubber layer thickness [mm] |
|---|---|---|---|---|---|
| 0.5 | 10 | 80 | 3 | 0.5 | 20 |
| 1 | 10 | 80 | 7 | 0.2 | 20 |
| 3 | 10 | 50 | 5 | 0.1 | 20 |
| 6 | 15 | 20 | 8 | 0.1 | 20 |
| 10 | 15 | 20 | 10 | 0.1 | 30 |

It is seen from the results as set forth in Table 1 that, in each of Examples 1 through 43, formation of bulges causing image dropouts was suppressed effectively, and the scumming resistance was excellent.

Examples in which the mean height of boehmite protrusions on the anodized film was less than 6 nm were higher in scumming resistance than Examples in which the mean height was not less than 6 nm but less than 15 nm.

In Examples 1 through 43, the mean height of boehmite protrusions on the anodized film was likely to be reduced as the water vapor for water vapor treatment was higher in temperature, or the treatment time was shorter.

When Examples 1 through 3 are compared with one another, in each of which the water vapor temperature was 130° C., the ratio (h/d) was larger and, accordingly, formation of bulges was suppressed more effectively as the treatment time was longer. The tendency applies to Examples 4 through 9 in each of which the water vapor temperature was 150° C., Examples 18 through 20 in each of which the water vapor temperature was 170° C., Examples 10 through 12 in each of which the water vapor temperature was 200° C., and Examples 17, 21 and 22 in each of which the water vapor temperature was 350° C.

When Examples 6, 13 and 14 are compared with one another, which were different from one another in aluminum carbide concentration, formation of bulges causing image dropouts was suppressed most effectively in Example 6 with the lowest aluminum carbide concentration (2 ppm).

When Examples 6, 15 and 16 are compared with one another, which were different from one another in conditions for graining treatment, formation of bulges causing image dropouts was suppressed effectively, and the scumming resistance was excellent in any of them irrespective of conditions for graining treatment.

When Examples 2, 6, 11 and 17 are compared with one another, in each of which the treatment time for water vapor treatment was five seconds, the ratio (h/d) was larger and, accordingly, formation of bulges causing image dropouts was suppressed more effectively as the water vapor temperature was higher.

By a comparison made between Examples 1 through 22 and Examples 23 through 43, it was found that the ratio (h/d) is influenced by preapplying treatment. In other words, the ratio (h/d) was likely to be increased in value, leading to a more effective suppression of bulge formation, by conducting preapplying treatment.

As an example: When Example 2 in which the water vapor for water vapor treatment had a temperature of 130° C. is compared with Examples 23 through 27 with the same water vapor temperature, 130° C., the ratio (h/d) was likely to be larger, leading to a more effective suppression of bulge formation, in Examples 23 through 27 with preapplying treatment than Example 2 without preapplying treatment even though other conditions were identically specified.

Such tendency is also seen from the results of comparison between Example 19 and Examples 28 through 31 in each of which the water vapor temperature was 170° C., comparison between Example 10 and Examples 32 through 35 in each of which the water vapor temperature was 200° C. and the time for water vapor treatment was one second, comparison between Example 11 and Examples 36 through 39 in each of which the water vapor temperature was 200° C. and the time for water vapor treatment was five seconds, and comparison between Example 21 and Examples 40 through 43 in each of which the water vapor temperature was 350° C.

In addition, it was found that the ratio (h/d) is also influenced by the amount of water applied in preapplying treatment.

With respect to Examples 23 through 27, for instance, the ratio (h/d) in Example 23 with preapplying treatment conducted with 0.5 cc/m² of water was not increased as compared with that in Example 2 without preapplying treatment, and the ratio (h/d) in Example 27 with preapplying treatment conducted with 10 cc/m² of water was slightly reduced as compared with that in Example 2. On the other hand, the ratio (h/d) in each of Examples 24 through 26 with preapplying treatment conducted with 1 to 6 cc/m² of water was larger than that in Example 2.

Preapplying treatment was more effective as the water vapor for water vapor treatment was higher in temperature. When the water vapor temperature was 130° C., for instance, the ratio (h/d) in Example 25 with preapplying treatment was about 1.2 times as large as that in Example 2 without preapplying treatment, while the ratio (h/d) in Example 29 with preapplying treatment was about 1.3 times as large as that in Example 19 without preapplying treatment when the water vapor temperature was 170° C.

In contrast, in Comparative Example 1 in which water vapor treatment was not conducted, formation of bulges causing image dropouts was in no way suppressed.

In Comparative Examples 2 and 3 in which water vapor treatment was conducted at a temperature lower than 130° C., the mean height of boehmite protrusions on the anodized film was over 15 nm, so that the scumming resistance was poor. In addition, the ratio (h/d) was less than 0.2, that is to say, formation of bulges causing image dropouts was not so effectively suppressed.

What is claimed is:

1. A lithographic printing plate support, which comprises an aluminum plate and an anodized film of aluminum provided on the aluminum plate, and has a micropore extending in the anodized film in a direction of depth from a film surface opposite with a film surface facing the aluminum plate, wherein:

the micropore is sealed at least partially on its inside with protrusions made of boehmite, and protrusions made of boehmite which are located on the anodized film have a mean height of less than 6 nm.

2. The lithographic printing plate support according to claim 1, wherein a mean pore diameter (d) of said micropore and a mean height (h) of said protrusions for sealing the micropore as measured in a pore diameter direction are such that a ratio (h/d) of the mean height to the mean pore diameter is not less than 0.2.

3. A presensitized plate comprising the lithographic printing plate support according to claim 1 and a photosensitive layer provided on the support, wherein the photosensitive layer contains (A) a sensitizing dye, (B) a polymerization initiator, (C) a polymerizable compound, and (D) a binder polymer.

4. A presensitized plate comprising the lithographic printing plate support according to claim 2 and a photosensitive layer provided on the support, wherein the photosensitive layer contains (A) a sensitizing dye, (B) a polymerization initiator, (C) a polymerizable compound, and (D) a binder polymer.

5. The presensitized plate according to claim 3, which comprises a protective layer provided on said photosensitive layer.

6. The presensitized plate according to claim 4, which comprises a protective layer provided on said photosensitive layer.

* * * * *